(12) United States Patent
Razavieh et al.

(10) Patent No.: US 11,967,637 B2
(45) Date of Patent: Apr. 23, 2024

(54) FIN-BASED LATERAL BIPOLAR JUNCTION TRANSISTOR WITH REDUCED BASE RESISTANCE AND METHOD

(71) Applicant: GlobalFoundries U.S. Inc., Malta, NY (US)

(72) Inventors: Ali Razavieh, Saratoga Springs, NY (US); Jagar Singh, Clifton Park, NY (US); Haiting Wang, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 88 days.

(21) Appl. No.: 17/687,741

(22) Filed: Mar. 7, 2022

(65) Prior Publication Data

US 2023/0061156 A1 Mar. 2, 2023

Related U.S. Application Data

(60) Provisional application No. 63/253,143, filed on Oct. 7, 2021, provisional application No. 63/237,295, filed on Aug. 26, 2021.

(51) Int. Cl.
*H01L 29/735* (2006.01)
*H01L 27/06* (2006.01)
(Continued)

(52) U.S. Cl.
CPC ........ *H01L 29/735* (2013.01); *H01L 29/0808* (2013.01); *H01L 29/0821* (2013.01);
(Continued)

(58) Field of Classification Search
CPC .............. H01L 29/735; H01L 29/0808; H01L 29/0821; H01L 29/1008; H01L 29/7302;
(Continued)

(56) References Cited

U.S. PATENT DOCUMENTS 7,897,995 B2   3/2011 Yang et al.
8,258,602 B2   9/2012 Ke et al.
(Continued)

*Primary Examiner* — Natalia A Gondarenko
(74) *Attorney, Agent, or Firm* — Francois Pagette; Hoffman Warnick LLC

(57) ABSTRACT

A disclosed structure includes a fin-based bipolar junction transistor (BJT) with reduced base resistance. The BJT includes one or more semiconductor fins. Each semiconductor fin has opposing sidewalls, a first width, and a base recess, which extends across the first width through the opposing sidewalls. The BJT includes a base region positioned laterally between collector and emitter regions. The base region includes a base semiconductor layer (e.g., an intrinsic base layer), which fills the base recess and which has a second width greater than the first width such that the base semiconductor layer extends laterally beyond the opposing sidewalls. In a BJT with multiple semiconductor fins, the base recess on each semiconductor fin is filled with a discrete base semiconductor layer. The base region further includes an additional base semiconductor layer (e.g., an extrinsic base layer) covering the base semiconductor layer(s). Also disclosed is a method of forming the structure.

20 Claims, 23 Drawing Sheets

(51) Int. Cl.
*H01L 29/08* (2006.01)
*H01L 29/10* (2006.01)
*H01L 29/66* (2006.01)
*H01L 29/73* (2006.01)
*H01L 29/737* (2006.01)
*H01L 29/78* (2006.01)

(52) U.S. Cl.
CPC ...... *H01L 29/1008* (2013.01); *H01L 29/6625* (2013.01); *H01L 29/7302* (2013.01); *H01L 27/0623* (2013.01); *H01L 29/0817* (2013.01); *H01L 29/66545* (2013.01); *H01L 29/66795* (2013.01); *H01L 29/737* (2013.01); *H01L 29/785* (2013.01)

(58) Field of Classification Search
CPC ........... H01L 29/0817; H01L 29/66545; H01L 29/737; H01L 29/785; H01L 29/0657; H01L 29/66242; H01L 29/6625; H01L 29/66795–66818; H01L 21/02293; H01L 21/02634; H01L 21/02653; H01L 21/02636; H01L 21/02631; H01L 21/76897; H01L 21/823431; H01L 21/823468; H01L 21/823475; H01L 21/823493; H01L 21/82345; H01L 21/82385; H01L 21/823842; H01L 27/0623; H01L 27/0823; H01L 27/0886; H01L 27/0924; H01L 27/10879; H01L 27/1211; H01L 27/1251; H01L 21/82341; H01L 21/845; H01L 21/823821; H01L 21/8232; H01L 21/8239; H01L 21/8249; H01L 21/82285

USPC ................ 257/197, 565, 306, 133, 368, 586

See application file for complete search history.

(56) References Cited

U.S. PATENT DOCUMENTS

| | | |
|---|---|---|
| 9,263,583 B2 | 2/2016 | Cai et al. |
| 9,419,087 B2 | 8/2016 | Hu et al. |
| 2010/0155776 A1 | 6/2010 | Lee |
| 2011/0053331 A1 | 3/2011 | Kakoschke et al. |
| 2013/0168819 A1 | 7/2013 | Chang et al. |
| 2015/0263091 A1 | 9/2015 | Hashemi et al. |
| 2015/0287650 A1* | 10/2015 | Chang ................ H01L 21/3065 257/586 |
| 2018/0269289 A1* | 9/2018 | Balakrishnan ........ H01L 29/735 |
| 2019/0165150 A1* | 5/2019 | Hashemi ............. H01L 29/1008 |
| 2021/0376096 A1* | 12/2021 | Vellianitis ......... H01L 29/66795 |

\* cited by examiner

US 11,967,637 B2

FIN-BASED LATERAL BIPOLAR JUNCTION TRANSISTOR WITH REDUCED BASE RESISTANCE AND METHOD

BACKGROUND

Field of the Invention

The present invention relates to semiconductor structures and, more particularly, to embodiments of a semiconductor structure including a lateral bipolar junction transistor (BJT) and to embodiments of a method of forming the semiconductor structure.

Description of Related Art

Bipolar junction transistors (BJTs) are typically formed as vertical devices (e.g., with an in-substrate collector, a base aligned above the collector, and an emitter aligned above the base). However, integration of such vertical BJTs with complementary metal oxide semiconductor (CMOS) processing and, particularly, with fin-type field effect transistor (finFET) processing, can be complex and costly.

SUMMARY

Disclosed herein are embodiments of a semiconductor structure. The semiconductor structure can include a semiconductor fin. The semiconductor fin can have opposing sidewalls and a first width, as measured between the opposing sidewalls. The semiconductor fin can further include a base recess, which extends downward from the top of the semiconductor fin and which further extends laterally across the full first width through the opposing sidewalls. The semiconductor structure can further include a base region. This base region can include a base semiconductor layer (e.g., an intrinsic base layer), which is on the semiconductor fin at least within the base recess and which has a second width that is wider than the first width, as measured in the same direction, such that the base semiconductor layer extends laterally beyond the opposing sidewalls of the semiconductor fin. The base region can further include an additional base semiconductor layer (e.g., an extrinsic base layer) on the base semiconductor layer. For example, the additional base semiconductor layer can wrap over the top and two sides of the base semiconductor layer.

Alternative embodiments of the semiconductor structure can include multiple semiconductor fins (e.g., two or more parallel semiconductor fins). Each semiconductor fin can have opposing sidewalls and a first width, as measured between the opposing sidewalls. Each semiconductor fin can further include a base recess, which extends downward from the top of the semiconductor fin and which further extends laterally across the full first width through the opposing sidewalls. The base recesses can be aligned across the fins. The semiconductor structure can further include a base region. The base region can include base semiconductor layers (e.g., intrinsic base layers). Each of the base semiconductor layer can be on a corresponding semiconductor fin at least in the base recess thereof and can have a second width that is wider than the first width, as measured in the same direction, such that the base semiconductor layer extends laterally beyond the opposing sidewalls of the corresponding semiconductor fin. The base region can further include an additional base semiconductor layer (e.g., an extrinsic base layer) on the base semiconductor layers. For example, the additional base semiconductor layer can wrap over the top and two sides of each base semiconductor layer.

Also disclosed herein are embodiments of a method for forming the above-described structures. For example, an embodiment of the method can include forming a semiconductor fin having opposing sidewalls and a first width, as measured between the opposing sidewalls. The method can further include forming a base recess, which extends downward from the top of the semiconductor fin and which further extends laterally across the full first width through the opposing sidewalls. The method can further include forming a base region. The base region can be formed so that it includes a base semiconductor layer, which is on the semiconductor fin at least in the base recess and which has a second width that is wider than the first width, as measured in the same direction, such that the base semiconductor layer extends laterally beyond the opposing sidewalls of the semiconductor fin. The base region can further be formed so that it includes an additional base semiconductor layer (e.g., an extrinsic base layer) on the base semiconductor layer. For example, the additional base semiconductor layer can wrap over the top and two sides of the base semiconductor layer. Alternative embodiments of the method can include forming such a structure using multiple semiconductor fins (e.g., two or more parallel semiconductor fins), as discussed further in the detailed description section.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, bipolar junction transistors (BJTs) are typically formed as vertical devices (e.g., with an in-substrate collector, a base aligned above the collector, and an emitter aligned above the base). However, integration of such vertical BJTs with complementary metal oxide semiconductor (CMOS) processing and, particularly, with fin-type field effect transistor (finFET) processing, can be complex and costly. Lateral BJTs have been developed; however, such lateral BJTs often suffer from poor performance.

In view of the foregoing, disclosed herein are embodiments of a semiconductor structure including a fin-based lateral bipolar junction transistor (BJT) (e.g., a non-heterojunction BJT or a heterojunction bipolar transistor (HBT)) with reduced base resistance (Rb) for improved performance (e.g., increased maximum oscillation frequency (fmax)). The BJT can include one or more semiconductor fins. Each semiconductor fin can have opposing sidewalls, a first width, as measured between the opposing sidewalls, and a base recess, which extends across the full first width through the opposing sidewalls. The BJT can further include a base region positioned laterally between a collector region and an emitter region. The base region can specifically include a base semiconductor layer (e.g., an intrinsic base layer), which fills the base recess and which has a second width that is greater than the first width (as measured in the same direction) such that the base semiconductor layer extends laterally beyond the opposing sidewalls. In the case of a BJT with multiple semiconductor fins, the base recess on each semiconductor fin can be filled with a discrete base semiconductor layer. The base region can further include an additional base semiconductor layer (e.g., an extrinsic base layer) covering the base semiconductor layer(s). Also disclosed are embodiments of a method of forming the structure that can be easily integrated with replacement metal gate (RMG) fin-type field effect transistor (finFET) processing.

Figure 1:
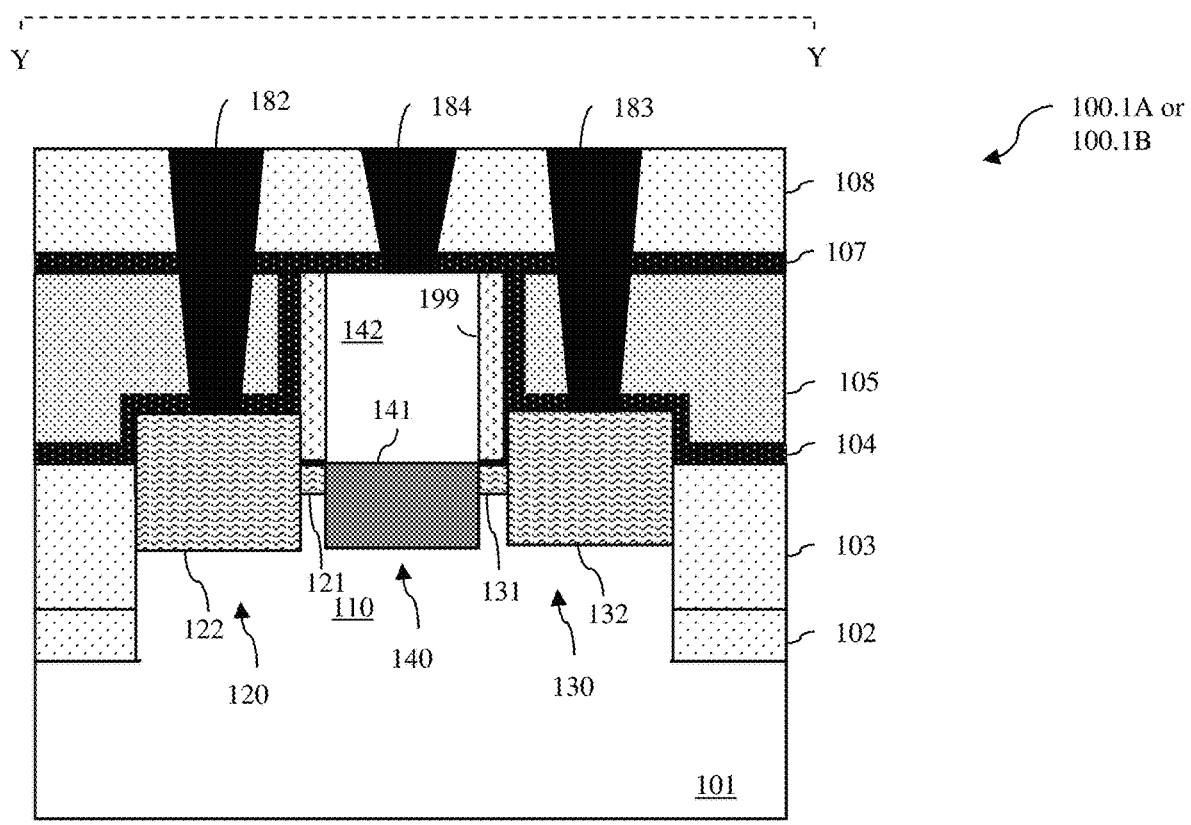
FIG. 1 is a cross-section diagram cutting along the length of a semiconductor fin in a semiconductor structure embodiment, which includes either a single-fin or multi-fin lateral bipolar junction transistor.
Figure 1B:
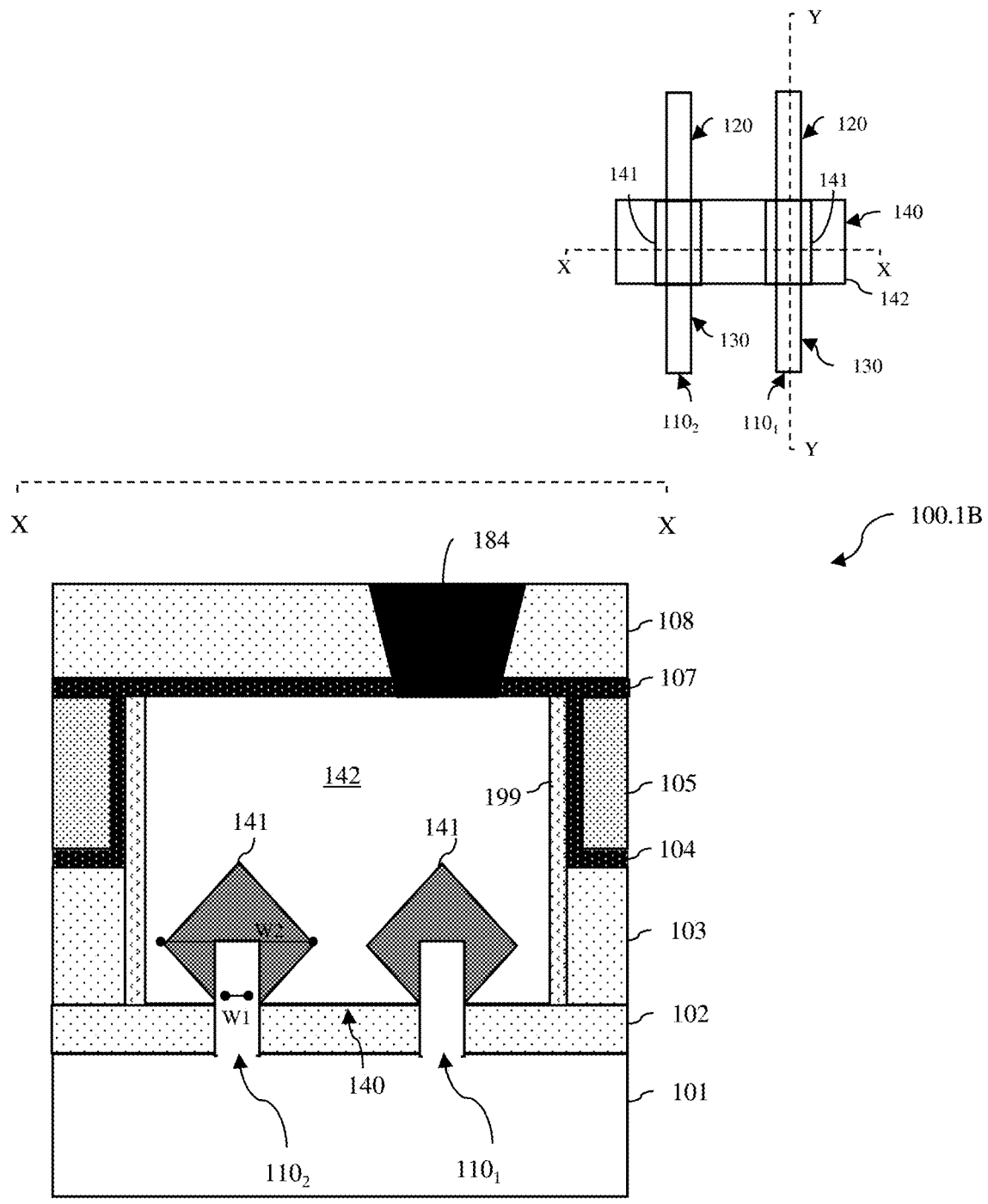
Figure 2:
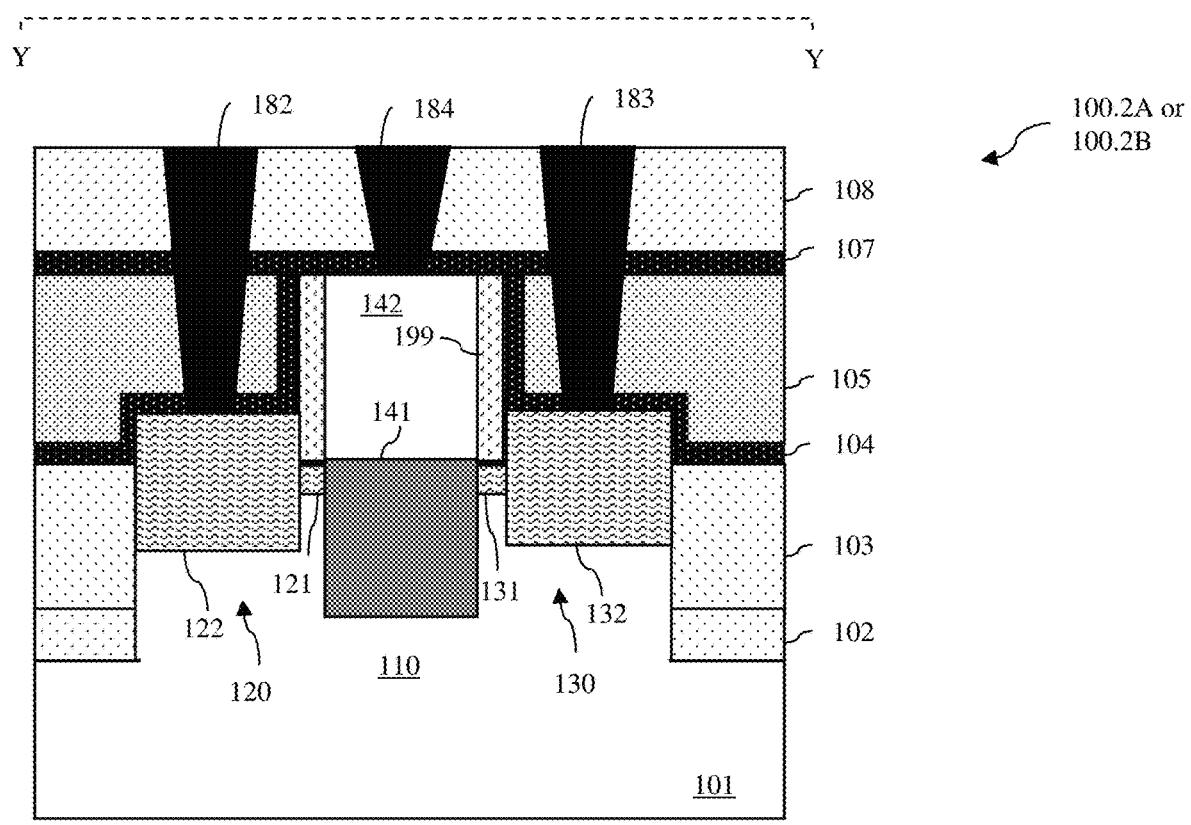
FIG. 2 is a cross-section diagram cutting along the length of a semiconductor fin in another semiconductor structure embodiment, which includes either a single-fin or multi-fin lateral bipolar junction transistor.
Figure 2A:
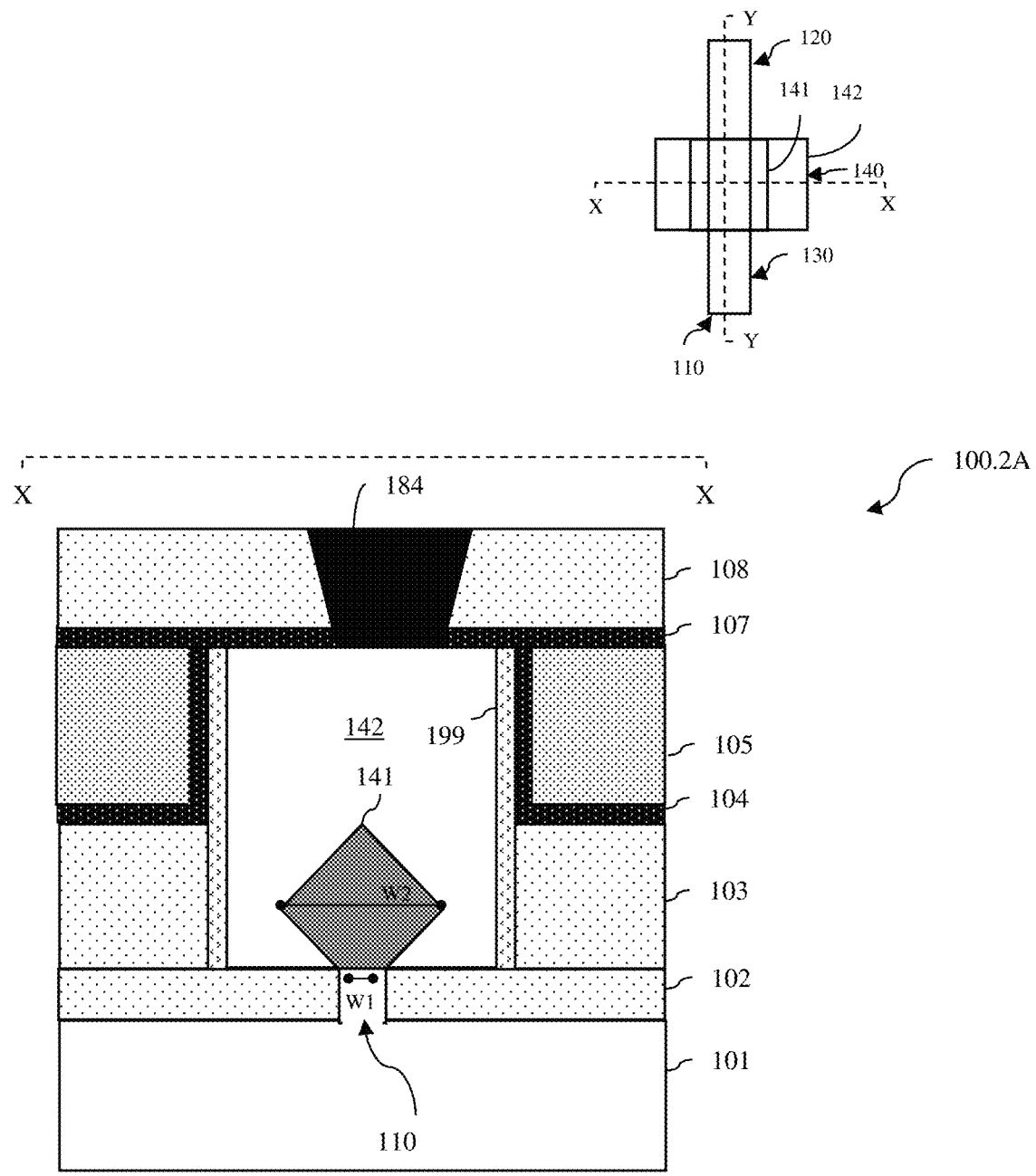
FIGS. 2A and 2B are alternative cross-section diagrams cutting across the width of the semiconductor fin or the width of the semiconductor fins, respectively, in the semiconductor structure embodiment shown in FIG. 2.
Figure 2B:
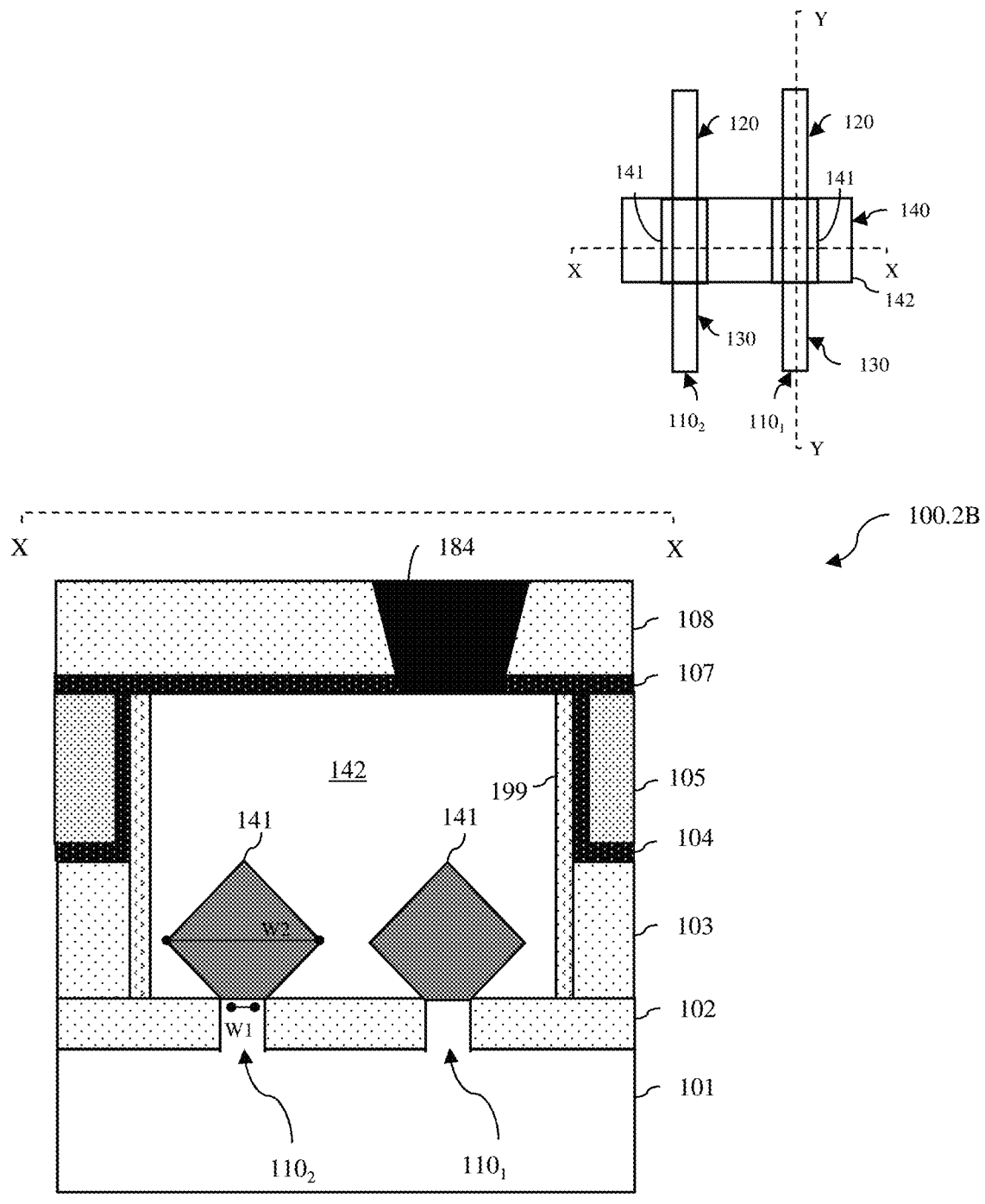

FIG. 1 is a cross-section diagram cutting along the length of a semiconductor fin in disclosed semiconductor structure embodiments, which include a fin-based lateral bipolar junction transistor (BJT) 100.1A or 100.1B (e.g., a non-heterojunction BJT or a heterojunction bipolar transistor (HBT), as discussed in greater detail below). In these embodiments, the BJT can be a single-fin BJT 100.1A (e.g., see the cross-section diagram cutting across the width of the semiconductor fin, as shown in FIG. 1B) or the BJT can be a multi-fin BJT 100.1B (e.g., see the cross-section diagram cutting across the widths of adjacent parallel semiconductor fins, as shown in FIG. 1B). FIG. 2 is a cross-section diagram cutting along the length of a semiconductor fin in additional disclosed semiconductor structure embodiments, which include a fin-based lateral bipolar junction transistor (BJT) 100.2A or 100.2B (e.g., a non-heterojunction BJT or a heterojunction bipolar transistor (HBT), as discussed in greater detail below). As in the previously mentioned embodiments, in these embodiments, the BJT can be a single-fin BJT 100.2A (e.g., see the cross-section diagram cutting across the width of the semiconductor fin, as shown in FIG. 2A) or the BJT can be a multi-fin BJT 100.2B (e.g., see the cross-section diagram cutting across the widths of adjacent parallel semiconductor fins, as shown in FIG. 2B). As discussed in greater detail below, these embodiments 100.1A-100.1B or 100.2A-100.2B differ with respect to the fin height within the base region and, as a result, positioning of base material on the sidewalls of the fin or not.

More particularly, the semiconductor structure can include one or more semiconductor fins. For purposes of this disclosure, a "semiconductor fin" refers to a relatively thin, elongated, semiconductor body. Ideally, a semiconductor fin will have a three-dimensional rectangular shape with a uniform width from the bottom of the semiconductor fin proximal to the substrate to the top of the semiconductor fin distal from the substrate. However, those skilled in the art will recognize that semiconductor fins are typically formed using a selective anisotropic etch process and, as a result of this process, the sidewalls of the semiconductor fins may not be exactly vertical (i.e., perpendicular to the bottom surface of the substrate) and the fin width may be somewhat non-uniform (e.g., wider proximal to the substrate).

The semiconductor fin(s) can be part of a bulk semiconductor structure. For example, as illustrated, the semiconductor fin(s) can be etched into the top of a bulk semiconductor substrate 101 (e.g., a bulk silicon substrate) such that they extend essentially vertically from the substrate. In this case, an insulator layer 102 (e.g., a silicon dioxide layer) can be on the substrate laterally surrounding the lower portion of each semiconductor fin and extending laterally between adjacent, parallel semiconductor fins, if applicable. It should, however, be understood that the figures are not intended to be limiting. Alternatively, the semiconductor fin(s) can be part of a semiconductor-on-insulator structure (e.g., a silicon-on-insulator (SOI) structure). For example, the semiconductor fin(s) can be etched through a semiconductor layer (e.g., a silicon layer) on an insulator layer (e.g., a silicon dioxide layer) above a semiconductor substrate (e.g., a silicon substrate). In this case, the semiconductor fin(s) would extend essentially vertically from the top surface of the insulator layer. Furthermore, each semiconductor fin in the disclosed semiconductor structures could be a discretely patterned semiconductor fin, as illustrated. However, again, the figures are not intended to be limiting. Alternatively, during processing relatively long semiconductor fins could be formed and shallow trench isolation regions (STI) regions (not shown) can segment the long semiconductor fins into multiple shorter semiconductor fins.

The semiconductor structure can further include a fin-based lateral BJT (e.g., 100.1A, 100.1B, 100.2A, 100.2B).

It should be noted that in the disclosed embodiments the lateral BJT can be either an NPN-type BJT or a PNP-type BJT and can further be either a non-heterojunction BJT or a high performance heterojunction bipolar transistor (HBT). Those skilled in the art will recognize that a BJT typically includes three terminals: a collector, an emitter, and a base between the collector and the emitter. In a lateral BJT, the base is positioned laterally between collector and the emitter relative to the bottom surface of the substrate on which the BJT sits. An NPN-type BJT refers to a BJT with a P-type base, an N-type collector, and an N-type emitter; whereas a PNP-type BJT refers to a BJT with an N-type base, a P-type collector and a P-type emitter. In the discussion below, reference is made to semiconductor layers and/or regions being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the BJT is an NPN-type BJT or a PNP-type BJT. Specifically, if the BJT is an NPN-type HBT, then the first-type conductivity refers to P-type conductivity and the second-type conductivity refers to N-type conductivity. However, if the BJT is a PNP-type BJT, then the first-type conductivity refers to N-type conductivity and the second-type conductivity refers to P-type conductivity. See the detailed discussion below regarding different dopants that can be employed in semiconductor materials to achieve P-type conductivity or N-type conductivity. As mentioned above, the BJT can also be either a non-heterojunction BJT or an HBT. In a non-heterojunction BJT, the same semiconductor material (e.g., silicon) is used for the base, collector and emitter. In an HBT, the collector and emitter are made, at least in part, of one semiconductor material (e.g., silicon) and the base is made, at least in part, of a different semiconductor material (e.g., silicon germanium). The use of differing semiconductor materials at the emitter-base junction and at the base-collector junction creates heterojunctions suitable for handling higher frequencies.

Figure 1A:
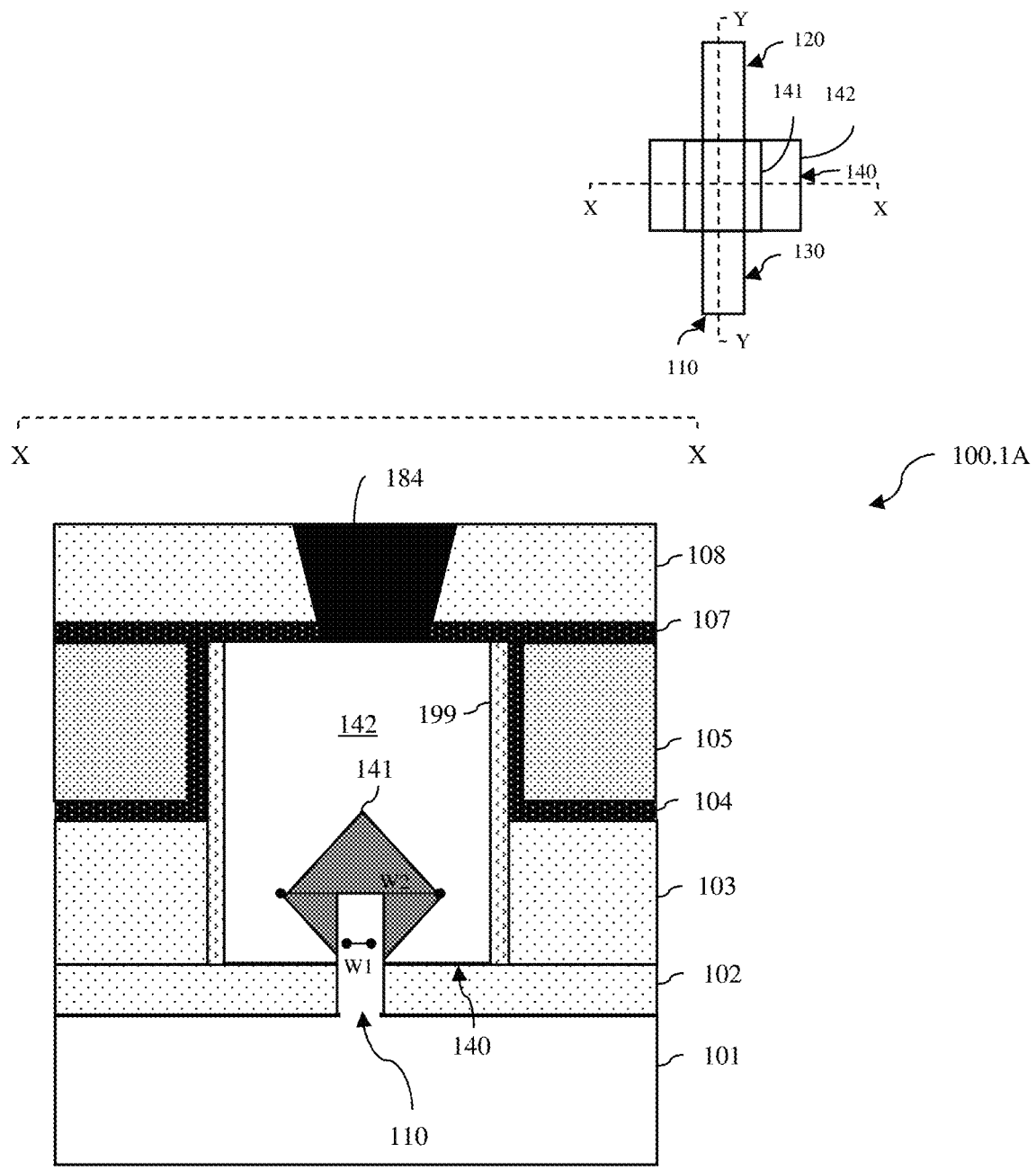
FIGS. 1A and 1B are alternative cross-section diagrams cutting across the width of the semiconductor fin or the width of the semiconductor fins, respectively, in the semiconductor structure embodiment shown in FIG. 1.

In any case, in some embodiments, the lateral BJT can be a single-fin BJT (e.g., see semiconductor fin 110 in the single-fin BJTs 100.1A of FIG. 1A and 100.2A of FIG. 2A). In other embodiments, the lateral BJT can be a multi-fin BJT (e.g., see the semiconductor fins $110_1$-$110_2$ in the BJTs 100.1B of FIG. 1B and 100.2B of FIG. 2B). It should be understood that the figures are not intended to be limiting and that, although FIGS. 1B and 2B only show dual-fin BJTs, alternatively, the multi-fin BJTs could include more than two semiconductor fins. In any case, each semiconductor fin (e.g., 110 as illustrated in FIGS. 1A and 2A or $110_1$-$110_2$ as illustrated in FIG. 1B or 2B) with the BJTs can have opposing sidewalls and a first width (W1), as measured between the opposing sidewalls.

The lateral BJT 100.1A, 100.1B, 100.2A, 100.2B can further include a base region 140. The base region 140 can include a base recess in a base portion of each semiconductor fin. The base recess can extend downward from the top of the base portion of the semiconductor fin and can further extend laterally across the full first width through the opposing sidewalls. In some embodiments, the bottom of the base recess can be at some level above the top surface of the insulator layer 102 (e.g., see the BJTs 100.1A of FIGS. 1 and 1A and 100.1B of FIGS. 1 and 1B). That is, although recessed, the base portion of the semiconductor fin(s) will still extend vertically above the level of the top surface of the insulator layer 102. In other embodiments, the bottom of the base recess can be essentially level with the top surface of the insulator layer 102 (e.g., see the BJTs 100.2A of FIGS. 2 and 2A and 100.2B of FIGS. 2 and 2B). That is, the base portion of the semiconductor fin(s) does not extend vertically above the level of the top surface of the insulator layer 102. In any case, the base region 140 can further include base semiconductor layer(s) 141 (e.g., intrinsic base layer(s)) and an additional base semiconductor layer 142.

More specifically, in the single-fin BJT 100.1A shown in FIGS. 1 and 1A, the base region 140 can further include a base semiconductor layer 141 (e.g., an intrinsic base layer), which is on the semiconductor fin 110 within the base recess, which has a second width (W2) that is wider than the first width (W1), as measured in the same direction, such that the base semiconductor layer 141 extends laterally beyond the opposing sidewalls of the semiconductor fin 110, and which further covers the opposing sidewalls of the base portion of the semiconductor fin 110 from the top surface of the insulator layer 102 upward. The base region 140 can further include an additional base semiconductor layer 142 (e.g., an extrinsic base layer). The additional base semiconductor layer 142 can cover the top of the base semiconductor layer and can further, optionally, cover two sides of the base semiconductor layer 141 wrapping down to the top surface of the insulator layer 102. The additional base semiconductor layer 142 can further fill remaining space within a base opening (discussed in greater detail below).

In the multi-fin BJT 100.1B shown in FIGS. 1 and 1B, the base region 140 can further include base semiconductor layers 141 (e.g., intrinsic base layers), which are on the semiconductor fins $110_1$-$110_2$, respectively. Each base semiconductor layer 141 can be in the base recess of a corresponding semiconductor fin, can have a second width (W2) that is wider than the first width (W1), as measured in the same direction, such that the base semiconductor layer 141 extends laterally beyond the opposing sidewalls of the corresponding semiconductor fin, and can further cover the opposing sidewalls of the base portion of the corresponding semiconductor fin from the top surface of the insulator layer 102 upward. The base region 140 can further include an additional base semiconductor layer 142 (e.g., an extrinsic base layer). The additional base semiconductor layer 142 can cover the tops of the base semiconductor layers 141 and can further, optionally, cover two sides of each base semiconductor layer 141 wrapping down to the top surface of the insulator layer 102. The additional base semiconductor layer 142 can further fill remaining space within a base opening (discussed in greater detail below).

In the single-fin BJT 100.2A shown in FIGS. 2 and 2A, the base region 140 can further include a base semiconductor layer 141 (e.g., an intrinsic base layer), which is on the semiconductor fin 110 within the base recess, which has a second width (W2) that is wider than the first width (W1), as measured in the same direction, such that the base semiconductor layer 141 extends laterally beyond the opposing sidewalls of the semiconductor fin 110. The base region 140 can further include an additional base semiconductor layer 142 (e.g., an extrinsic base layer). The additional base semiconductor layer 142 can cover the top of the base semiconductor layer and can further, optionally, cover two sides of the base semiconductor layer 141 wrapping down to the top surface of the insulator layer 102. The additional base semiconductor layer 142 can further fill remaining space within a base opening (discussed in greater detail below).

In the multi-fin BJT 100.2B shown in FIGS. 2 and 2B, the base region 140 can further include base semiconductor layers 141 (e.g., intrinsic base layers), which are on the semiconductor fins $110_1$-$110_2$, respectively. Each base semiconductor layer 141 can be in the base recess of a corresponding semiconductor fin, and can have a second width (W2) that is wider than the first width (W1), as measured in the same direction, such that the base semiconductor layer 141 extends laterally beyond the opposing sidewalls of the corresponding semiconductor fin. The base region 140 can further include an additional base semiconductor layer 142 (e.g., an extrinsic base layer). The additional base semiconductor layer 142 can cover the tops of the base semiconductor layers 141 and can further, optionally, cover two sides of each base semiconductor layer 141 wrapping down to the top surface of the insulator layer 102. The additional base semiconductor layer 142 can further fill remaining space within a base opening (discussed in greater detail below).

In each of the embodiments, the base semiconductor layer(s) 141 can be epitaxial semiconductor layer(s) selectively grown on exposed semiconductor surfaces of the semiconductor fin(s) (which are monocrystalline in structure) such that the base semiconductor layer(s) 141 are also monocrystalline in structure. The base semiconductor layer(s) can be either undoped (i.e., intrinsic semiconductor layer(s)) or doped so as to have the first-type conductivity at a relatively low conductivity level (e.g., so as to have P-conductivity in the case of an NPN-type BJT or N-conductivity in the case of a PNP-type BJT). Furthermore, the additional base semiconductor layer 142 can be non-selectively grown on exposed surfaces within a base opening including both semiconductor and dielectric surfaces such that the additional base semiconductor layer 142 is polycrystalline or amorphous in structure. The additional base semiconductor layer 142 can be doped so as to have the first-type conductivity at a relatively high conductivity level and, particularly, at a higher level than the base semiconductor layer(s). Thus, for example, the additional base semiconductor layer 142 can have P+ conductivity in the case of an NPN-type BJT or N+ conductivity in the case of a PNP-type BJT.

As mentioned above, the lateral BJT 100.1A, 100.1B, 100.2A, 100.2B can be either a non-heterojunction BJT or an HBT. For a non-heterojunction BJT, if the semiconductor fin(s) are monocrystalline silicon fin(s), then the base semiconductor layer(s) 141 can be, for example, epitaxial monocrystalline silicon layer(s) and the additional base semiconductor layer 142 can be an epitaxial polysilicon layer. For an HBT, if the semiconductor fin(s) are monocrystalline silicon fin(s), then the base semiconductor layer(s) 141 can be a different monocrystalline semiconductor material that that of the fin(s) (e.g., the base semiconductor layer(s) 141 can be epitaxial monocrystalline silicon germanium layer(s)) and the additional base semiconductor layer 142 can be an epitaxial polysilicon layer.

As discussed further in the description of the method embodiments, the base region 140 can be formed using what is referred to herein as replacement base (RB) processing, which is similar to replacement metal gate (RMG) processing in field effect transistor (FETs). Specifically, a sacrificial base structure is formed such that it traverses the semiconductor fin(s) and further such that it is positioned immediately adjacent to the top surface and opposing sides the semiconductor fin(s) and, particularly, the base portion(s) thereof. Dielectric sidewall spacers 199 are formed on the sidewalls of the sacrificial base structure. During subsequent processing, the sacrificial base structure is selectively removed leaving a base opening, which is defined by the dielectric sidewall spacers 199 and which exposes the base portion(s) of the semiconductor fin(s) and the top surface of the insulator layer 102 on either side. The exposed base portion(s) of the semiconductor fin(s) are recessed either partially (see lateral BJTs 100.1A and 100.1B) or all the way to the insulator layer 102 (see lateral BJTs 100.2A and 100.2B). The base semiconductor layer(s) 141 are formed by selective epitaxial deposition on exposed fin surfaces and the additional base semiconductor layer 142 is formed by non-selective epitaxial so as to fill any remaining space within the base opening. Thus, the additional base semiconductor layer 142 is laterally surrounded by and immediately adjacent to the dielectric sidewall spacers 199. The dielectric sidewall spacers 199 can be made of silicon nitride, silicon carbon nitride, silicon boron carbon nitride or any other suitable dielectric sidewall spacer material that will remain essentially intact during selective removal of the sacrificial bae structure during processing.

Optionally, the lateral BJT 100.1A, 100.1B, 100.2A, 100.2B can further include a collector extension region 121 and an emitter extension region 131. The extension regions 121 and 131 can be within each semiconductor fin adjacent to the top surface and further positioned laterally adjacent to opposing sides of the base recess (i.e., on a collector side and a base side, respectively, of the base recess) such that, on each semiconductor fin, a base semiconductor layer 141 is positioned laterally between the extension regions 121 and 131. The extension regions 121 and 131 can be relatively shallow dopant implant regions. The extension regions 121 and 131 can extend from the top surface of the semiconductor fin to some depth that is less than the depth of the base recess (i.e., the bottom of the extension regions 121 and 131 can be at some level above the level of the bottom of the base recess). The extension regions 121 and 131 can further have a different conductivity type than the additional base semiconductor layer 142. More specifically, the extension regions 121 and 131 can have a second-type conductivity at a relatively low conductivity level. Thus, for example, the extension regions 121 and 131 can have N-conductivity in the case of an NPN-type BJT or P-conductivity in the case of a PNP-type BJT. As illustrated, the extension regions 121 and 131 can be essentially vertically aligned with the sidewalls spacers 199 on top of the semiconductor fin(s).

The lateral BJT 100.1A, 100.1B, 100.2A, 100.2B can further include a collector region 120 and an emitter region 130. The base region 140 can be positioned laterally between the collector region 120 and the emitter region 130. If present, the collector extension region 121 will be positioned laterally between the collector region 120 and the base region 140. Similarly, if present, the emitter extension region 131 will be positioned laterally between the emitter region 130 and the base region 140. The collector and emitter regions 120 and 130 can have any suitable collector/emitter configuration on opposing sides of the base region 140 could be employed.

For example, in some embodiments, as illustrated, the collector region 120 and the emitter region 130 can include collector and emitter recesses within collector and emitter portions, respectively, of the semiconductor fin(s) on either side of the base region 140. The bottoms of the collector and emitter recesses can be at the same level as the bottom of the base recess or at a different level than the bottom of the base recess (e.g., the collector and emitter recesses could be shallower than the base recess. The bottoms of the collector and emitter recesses can be below the level of the bottoms of the extension regions 121 and 131, if present (e.g., the collector and emitter recesses could be deeper than the extension regions). In any case, the collector and emitter recesses can be filled (or overfilled) with collector and emitter semiconductor layers 122 and 132, respectively. The collector and emitter semiconductor layers can, for example, be made of the same semiconductor material as the semiconductor fin(s) (e.g., silicon) and can be doped so as to have the second-type conductivity at a relatively high conductivity level. Thus, for example, the collector and emitter semiconductor layers can have N+ conductivity in the case of an NPN-type BJT or P+ conductivity in the case of a PNP-type BJT. The collector and emitter semiconductor layers 122 and 132 can be epitaxial semiconductor layers, which, during processing, have been selectively grown on exposed surfaces of the semiconductor fin(s) such that they are monocrystalline in structure. In the multi-fin lateral BJTs (e.g., 100.1B or 100.2B.), the epitaxial growth process can be performed such that each semiconductor fin has a discrete collector region 120 (i.e., the collector semiconductor layers 122 on adjacent fins are physically separated) and further has a discrete emitter region 130 (i.e., the emitter semiconductor layers 132 on adjacent fins are physically separated). In this case, the multiple collector regions across all of the semiconductor fins can be electrically connected (e.g., by a local interconnect, by a conductive strap, by a combination of middle of the line (MOL) contacts and back end of the line (BEOL) wiring). Alternatively, the epitaxial growth process can be performed such that the collector semiconductor layers 122 on adjacent fins merge forming a single relatively large collector region 120 and further such that the emitter semiconductor layers 132 on adjacent fins similarly merge forming a single relatively large emitter region 130.

It should be understood that the exemplary collector and emitter regions 120 and 130 described above and illustrated in the figures are not intended to be limiting. As mentioned above, any suitable collector/emitter configuration on opposing sides of the base region 140 could be employed.

The semiconductor structure can further include various middle of the line dielectric layers positioned laterally adjacent and/or covering the lateral BJT. The MOL dielectric layers can include, for example, a first dielectric layer 103 on the insulator layer 102 and positioned laterally adjacent to semiconductor fin(s). The top surface of the first dielectric layer 103 can, for example, be essentially co-planar with the top surface of the semiconductor fin(s). The first dielectric layer 103 can, for example, be a silicon dioxide layer or other suitable dielectric layer. The MOL dielectric layers can further include a relatively thin, essentially conformal second dielectric layer 104 (also referred to herein as an etch stop layer) covering the first dielectric layer 103, the collector region 120, and the emitter region 130 and further positioned laterally immediately adjacent to and covering the outer surfaces of the sidewall spacers 199. This second dielectric layer 104 can be, for example, a silicon nitride layer or some other suitable layer of etch stop material. The MOL dielectric layers can further include a blanket third dielectric layer 105 on the second dielectric layer 104. This blanket third dielectric layer 105 could be, for example, a silicon dioxide layer, a doped silicon glass layer (e.g., a phosphosilicate glass (PSG) layer or a borophosphosilicate glass (BPSG) layer), or any other suitable layer of interlayer dielectric material. It should be noted that the top surface of the third blanket dielectric layer 105 can, for example, be essentially coplanar with top ends of the second dielectric layer 104 and the sidewall spacers 199 and further coplanar with the top surface of the additional base semiconductor layer 142. The MOL dielectric layers can further include a relatively thin fifth dielectric layer 107 (also referred to herein as an additional etch stop layer) on the top surface of the third blanket dielectric layer 105, the top ends of the second dielectric layer 104 and the sidewall spacers 199, and further on the top surface of the additional base semiconductor layer 142. This fifth dielectric layer 107 can be, for example, an additional silicon nitride layer or some other suitable layer of etch stop material. The MOL dielectric layers can also include a blanket sixth dielectric layer 108 on the fifth dielectric layer 107. This blanket sixth dielectric layer 108 could be, for example, a silicon dioxide layer, a doped silicon glass layer (e.g., a phosphosilicate glass (PSG) layer or a borophosphosilicate glass (BPSG) layer), or any other suitable layer of interlayer dielectric material.

The semiconductor structure can further include contacts 182-184 that extend through one or more of the MOL dielectric layers to the BJT terminals (i.e., to the collector region 120, the emitter region 130 and the base region 140).

In the above described semiconductor structure embodiments, the height of the base portion(s) of the fin(s) is effectively reduced and relatively wide intrinsic base layer (s) are formed thereon. As a result, base resistance (Rb) is reduced and BJT performance is improved (e.g., the maximum oscillation frequency (fmax) is increased).

Figure 3:
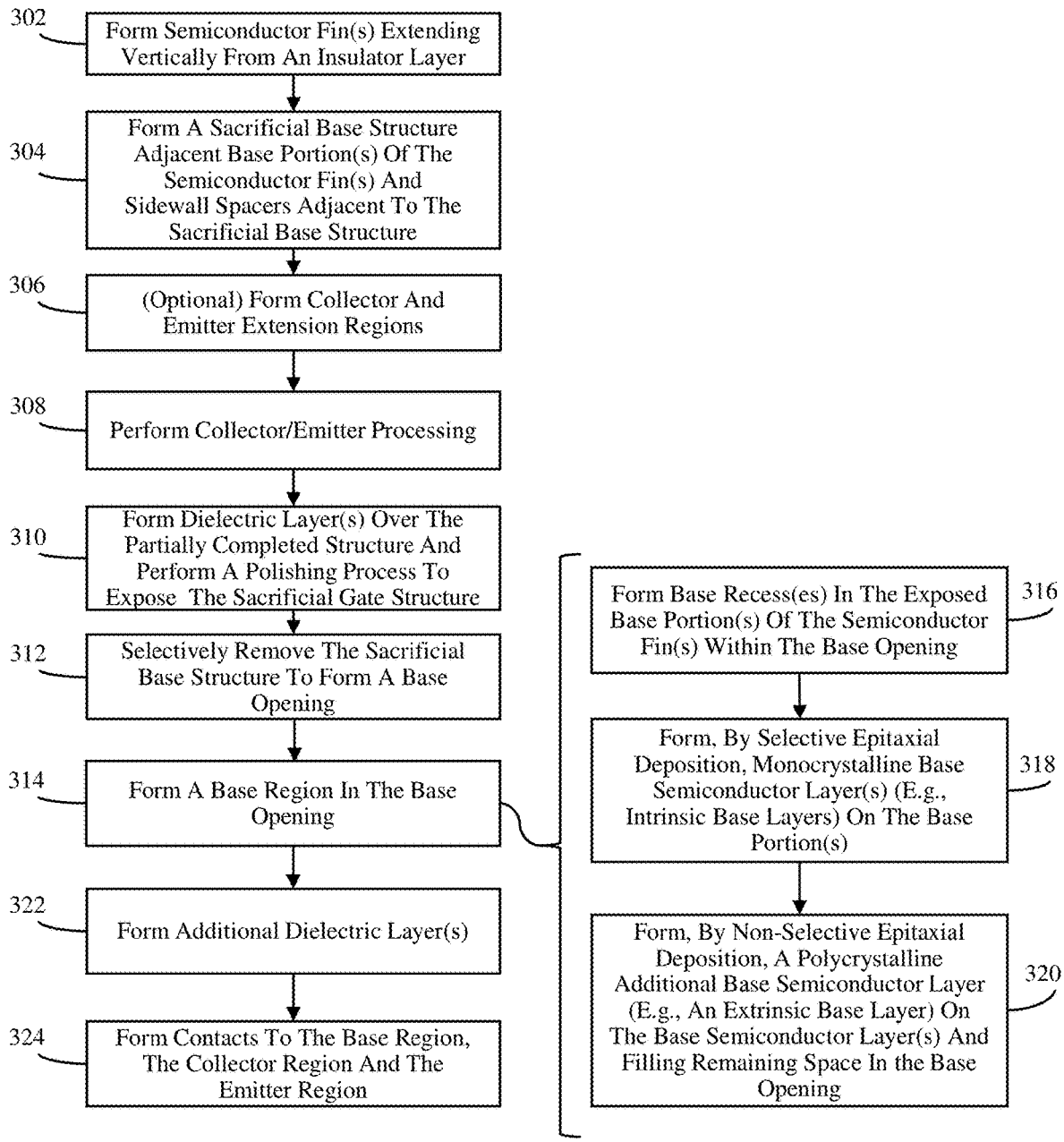
FIG. 3 is a flow diagram illustrating method embodiments for forming the semiconductor structure embodiments.

Referring to the flow diagram of FIG. 3, also disclosed herein are method embodiments for forming a semiconductor structure that includes a fin-based lateral bipolar junction transistor (BJT), such as the single-fin BJT 100.1A shown in FIGS. 1 and 1A and described above, the multi-fin BJT 100.1B shown in FIG. 1 and described above, the single-fin BJT 100.2A shown in FIGS. 2 and 2A and described above, or the multi-fin BJT 100.2B shown in FIGS. 2 and 2B and described above. In any case, the BJT can be either a non-heterojunction BJT or a heterojunction bipolar transistor (HBT) and either an NPN-type BJT or a PNP-type BJT.

Figure 4A:
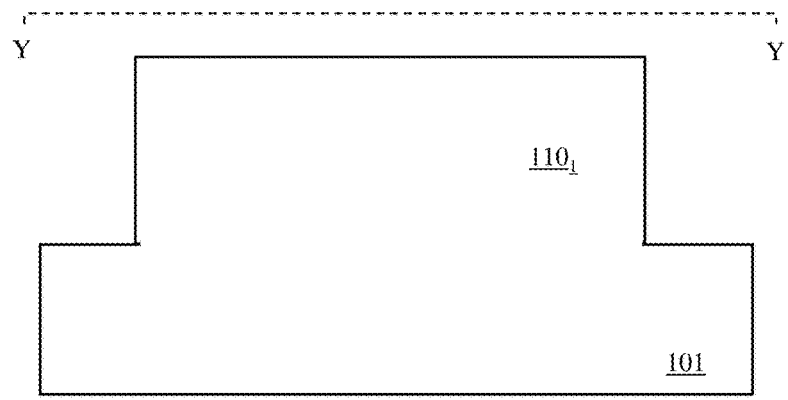
FIGS. 4A-4C are two different cross-section diagrams and a layout diagram of a partially completed semiconductor structure formed according to the flow diagram of FIG. 3.
Figure 4B:
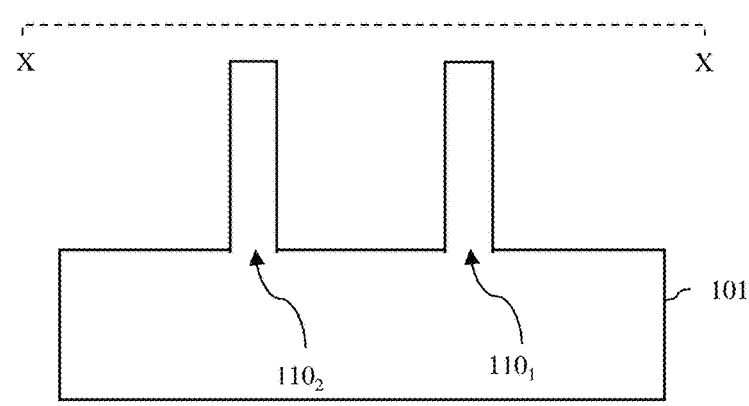
Figure 4C:
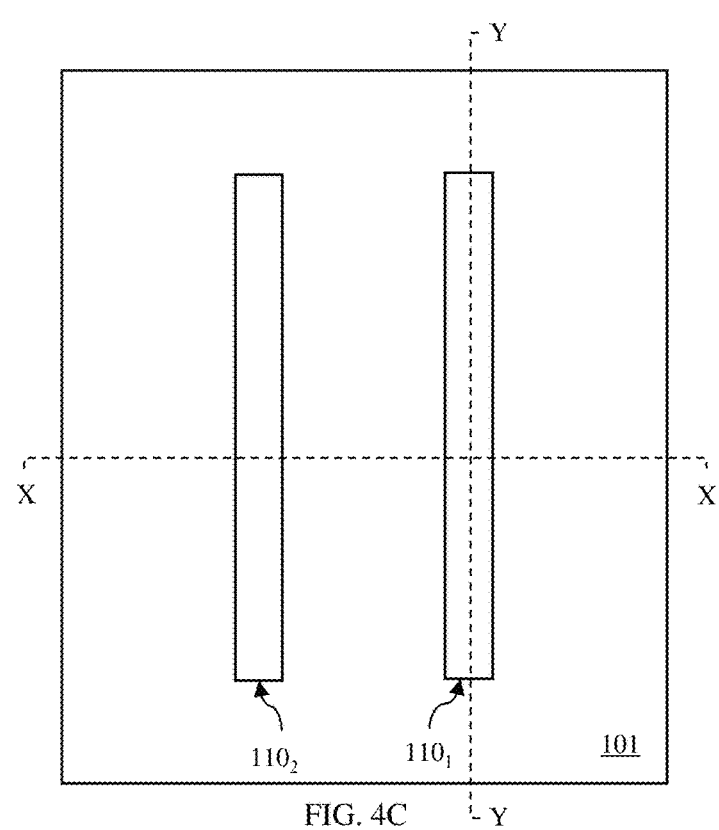

The method can include forming, for a lateral BJT, one or more semiconductor fins (see process 302, see also the different cross-section diagrams FIGS. 4A and 4B and the top view diagram of FIG. 4C). For purposes of illustration, FIGS. 4A-4C show the formation of two semiconductor fins $110_1$ and $110_2$ at process 302 and the remaining processes are shown with respect to formation of a BJT that includes these two semiconductor fins $110_1$ and $110_2$. However, it should be understood that these same process steps can be performed in order to form a BJT with a single semiconductor or, alternatively, a BJT with three or more semiconductor fins.

Figure 5A:
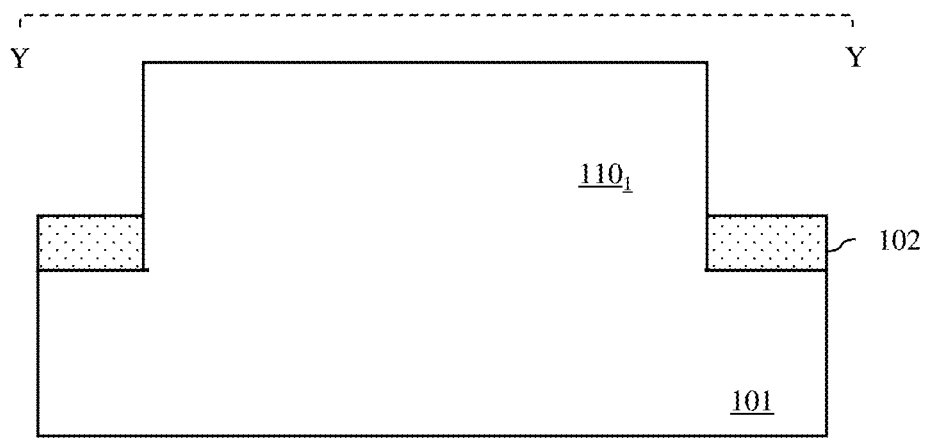
FIGS. 5A-5B are two different cross-section diagrams of a partially completed semiconductor structure formed according to the flow diagram of FIG. 3.
Figure 5B:
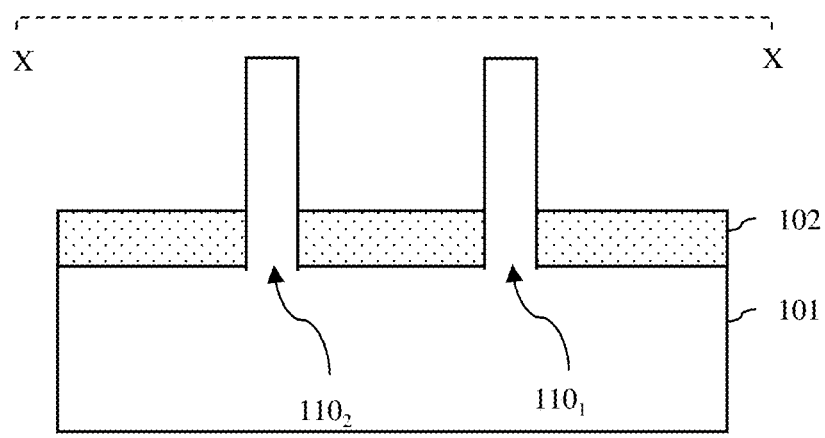

In any case, process 302 can begin with a bulk semiconductor substrate 101 (e.g., a monocrystalline silicon substrate). Formation of the semiconductor fin(s) (e.g., $110_1$-$110_2$) for the BJT at process 302 can optionally be performed concurrently with formation of semiconductor fins for fin-type field effect transistors (finFETs) elsewhere on the substrate. Fin(s) for BJT(s) can be formed in a BJT device area, whereas fins for finFETs can be formed in a finFET device area. In any case, conventional fin processing techniques can be employed to form semiconductor fin(s) at process 302. For example, lithographic processing techniques or sidewall image transfer (SIT) processing techniques could be employed to form fin mask(s) on the top surface of the semiconductor substrate. Such techniques are well known in the art and, thus, the details have been omitted form this specification in order to allow the reader to focus on the disclosed embodiments. Following fin mask formation, a selective anisotropic etch process can be performed in order to pattern the semiconductor fin(s) into the upper portion of the semiconductor substrate. For purposes of this disclosure, a "semiconductor fin" refers to a relatively thin, elongated, semiconductor body. Typically, a semiconductor fin will have a three-dimensional rectangular shape with opposing sides and opposing ends. Ideally, the semiconductor fin will have a first width (W1), as measured between the opposing sides, and the width will be essentially uniform from the bottom of the semiconductor fin adjacent to the substrate to the top of the semiconductor fin. However, those skilled in the art will recognize that semiconductor fins are typically formed using a selective anisotropic etch process and, as a result of this process, the sidewalls of the semiconductor fins may not be exactly vertical (i.e., perpendicular to the bottom surface of the substrate) and the fin width may be somewhat non-uniform (e.g., wider proximal to the substrate). When using a bulk semiconductor substrate 101, the method can further include depositing an insulator layer 102 over the partially completed structure and further recessing the insulator layer 102 so that it laterally surrounds a lower portion of each semiconductor fin (e.g., $110_1$-$110_2$) and extends laterally between adjacent semiconductor fins, if applicable (e.g., see the different cross-section diagrams FIGS. 5A and 5B). This insulator layer 102 can include one or more layers of isolation material. For example, the insulator layer 102 could be a single insulator layer (e.g., a single silicon dioxide layer or a single layer of some other suitable isolation material), as illustrated. Alternatively, the insulator layer 102 could include multiple different insulator layers (not shown).

Although not shown, the method could alternatively begin with a semiconductor-on-insulator structure, which includes a semiconductor substrate (e.g., a silicon substrate), an insulator layer (e.g., a buried oxide layer) on the semiconductor substrate, and a relatively thick semiconductor layer (e.g., a monocrystalline silicon layer) on the insulator layer. Fin(s) can be formed in essentially the same manner as described above, but etching completely through the semiconductor layer. In this case, there is no need to form an additional insulator layer around the lower portion(s) of the fin(s).

Furthermore, each semiconductor fin formed at process 302 can be a discretely patterned semiconductor fin, as illustrated. However, the figures are not intended to be limiting. Alternatively, at process 302, relatively long semiconductor fins could be patterned and shallow trench isolation regions (STI) regions (not shown) can subsequently be formed to segment the long semiconductor fins into shorter semiconductor fins for use in BJT formation.

Figure 6A:
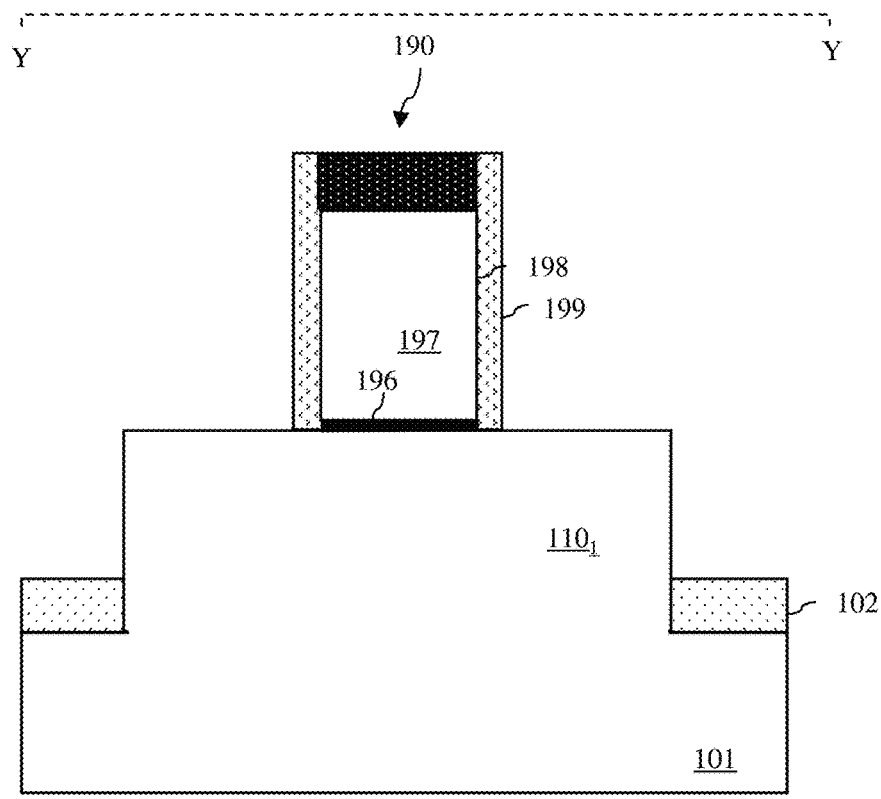
FIGS. 6A-6B are two different cross-section diagrams of a partially completed semiconductor structure formed according to the flow diagram of FIG. 3.
Figure 6B:
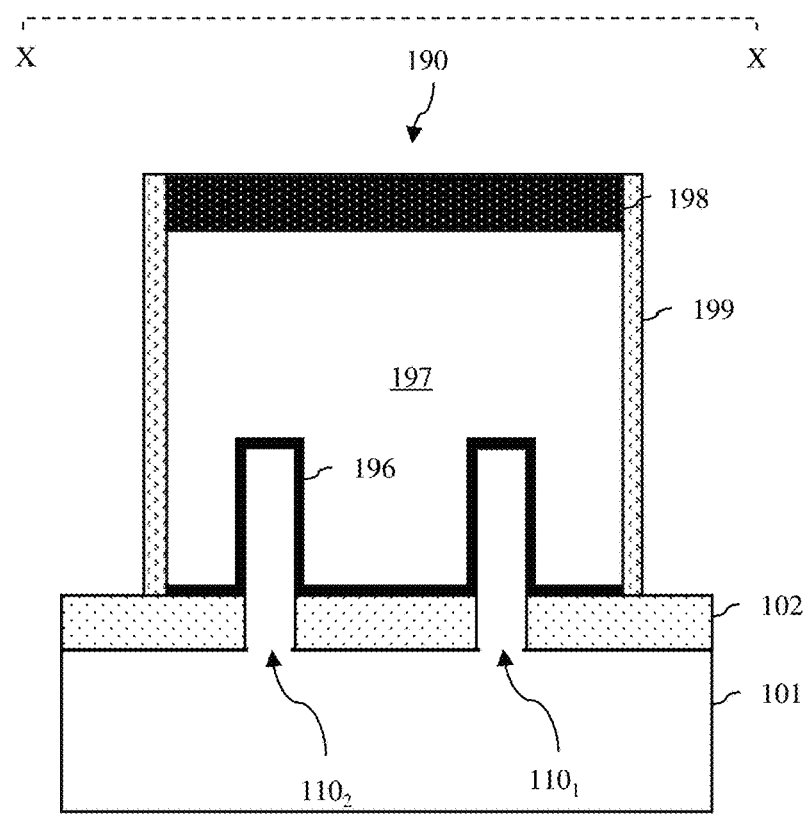

The method can further include forming a sacrificial base structure 190 traversing base portion(s) of the semiconductor fin(s) (e.g., $110_1$-$110_2$) (see process 306, see also the different cross-section diagrams FIGS. 6A and 6B). The sacrificial base structure 190 can specifically be formed adjacent to the top surface and opposing sides of the base portion of each semiconductor fin (e.g., $110_1$-$110_2$) and further on the top surface of the adjacent portions of the insulator layer 102 on either side and extending between the fins, if applicable. Formation of the sacrificial base structure 190 can optionally be performed concurrently with formation of sacrificial gate structures for fin-type field effect transistors (finFETs) elsewhere on the substrate. For example, a sacrificial stack of layers can be deposited over the partially completed structure. The sacrificial stack can include, for example, a conformal oxide layer 196, a blanket polysilicon layer 197 on the conformal oxide layer, and a hardmask layer 198 (e.g., a silicon nitride layer) on the polysilicon layer 197. Alternatively, any other suitable materials could be employed for the sacrificial stack. The sacrificial stack can subsequently be patterned (e.g., using conventional lithographic patterning and etch techniques such that it only covers the base portion(s) of the semiconductor fin(s) and so that collector and emitter portions of the semiconductor fin(s) on either side of the base portion are exposed. Dielectric sidewall spacers 199 can subsequently be formed on the sidewalls of the sacrificial base structure 190 using conventional sidewall spacer formation techniques. For example, a spacer layer of silicon nitride, silicon carbon nitride, silicon boron carbon nitride or any other suitable dielectric sidewall spacer material can be conformally deposited and the anisotropically etched so that it remains, as sidewall spacers, only on vertical surfaces.

It should be noted that in subsequent process steps, reference is made to semiconductor layers and/or regions being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the BJT is an NPN-type BJT or a PNP-type BJT. Specifically, if the BJT is an NPN-type HBT, then the first-type conductivity refers to P-type conductivity and the second-type conductivity refers to N-type conductivity. However, if the BJT is a PNP-type BJT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

Following formation of the dielectric sidewall spacers 199, collector/emitter processing can be performed including, but not limited to, formation of a collector region 120 and an emitter region 130 on opposing sides of the sacrificial base structure 190 (see process 308). Collector/emitter processing can optionally be performed concurrently with source/drain processing for fin-type field effect transistors (finFETs) elsewhere on the substrate. Furthermore, collector/emitter processing can be performed so that the resulting collector and emitter regions have any suitable collector/emitter configuration.

Figure 7A:
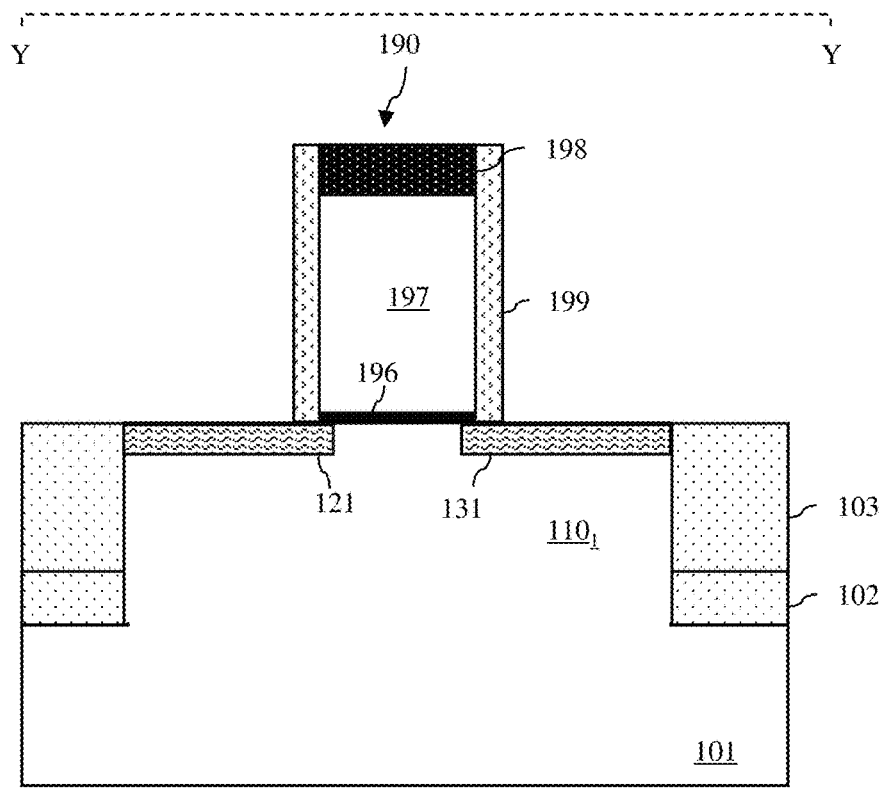
FIGS. 7A-7B are two different cross-section diagrams of a partially completed semiconductor structure formed according to the flow diagram of FIG. 3.
Figure 7B:
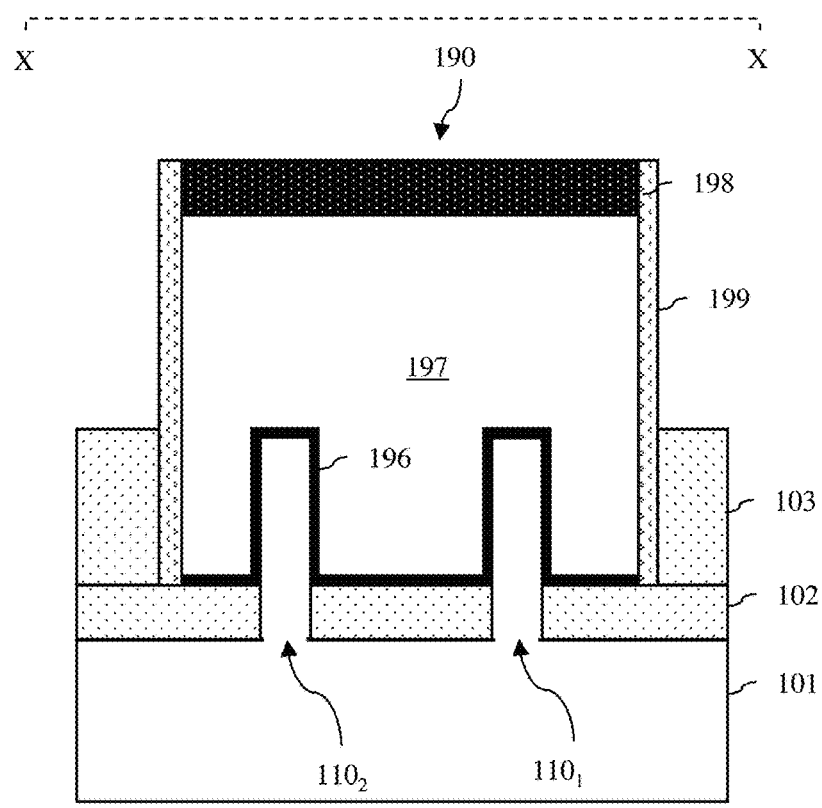
Figure 8A:
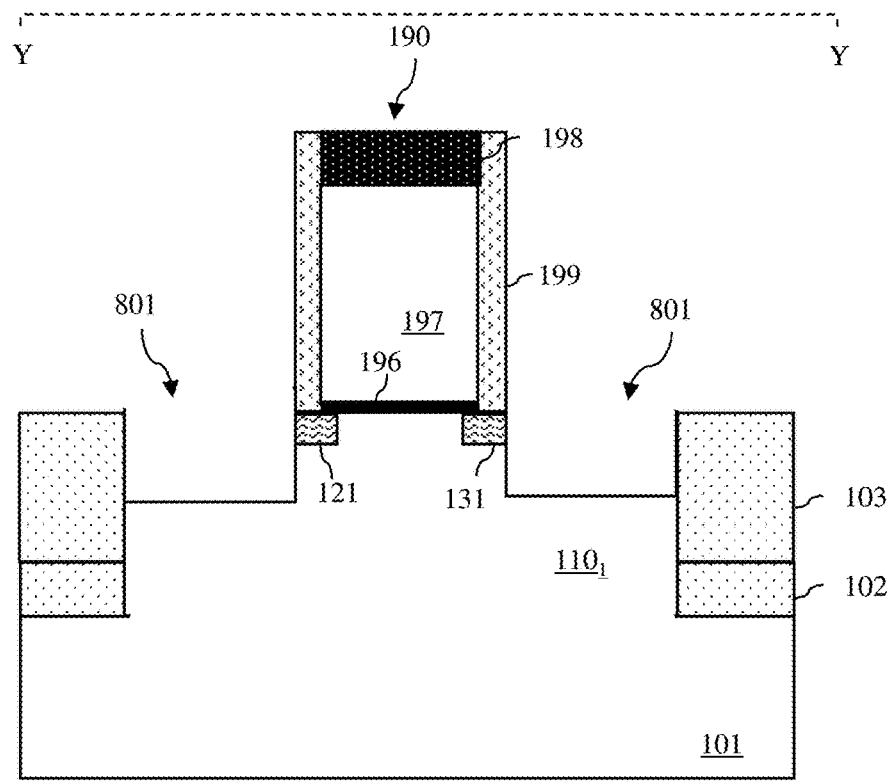
FIGS. 8A-8B are two different cross-section diagrams of a partially completed semiconductor structure formed according to the flow diagram of FIG. 3.
Figure 8B:
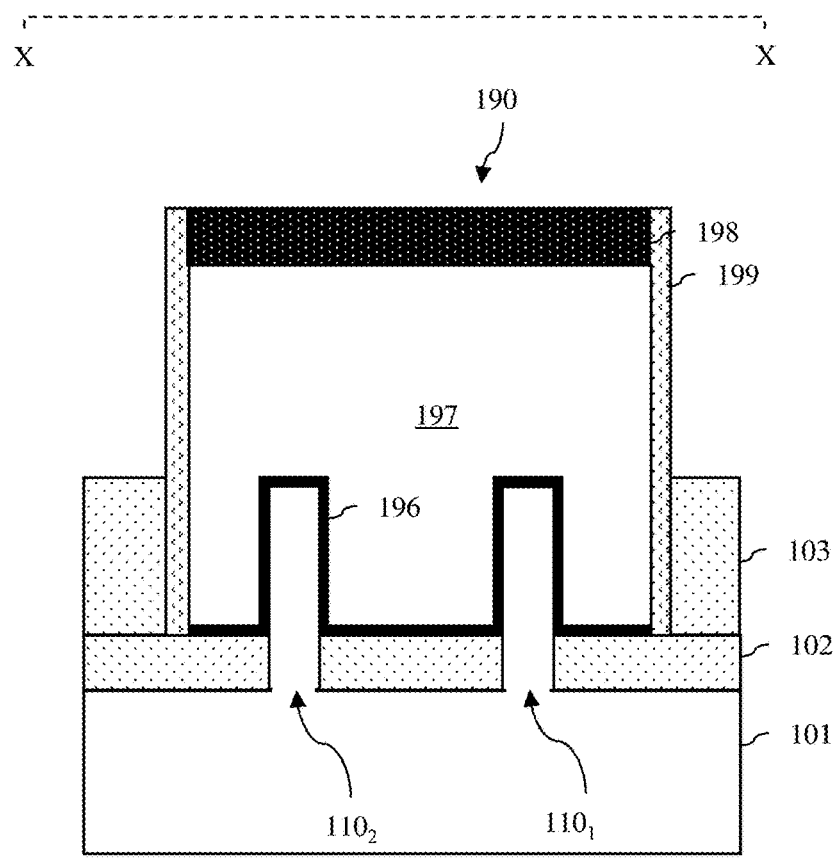
Figure 9A:
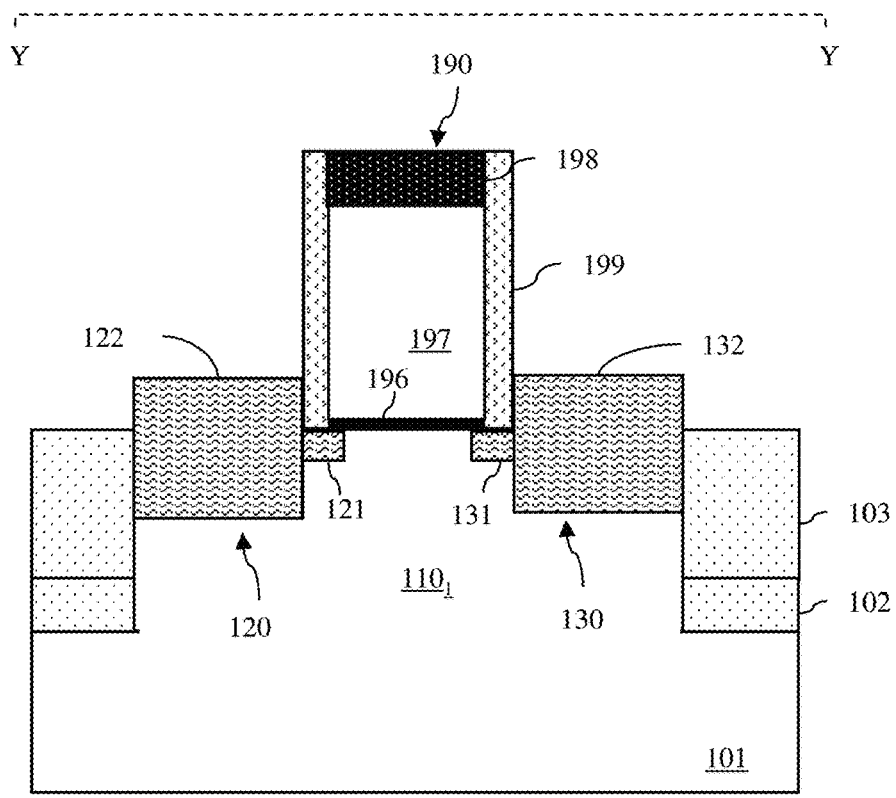
FIGS. 9A-9B are two different cross-section diagrams of a partially completed semiconductor structure formed according to the flow diagram of FIG. 3.
Figure 9B:
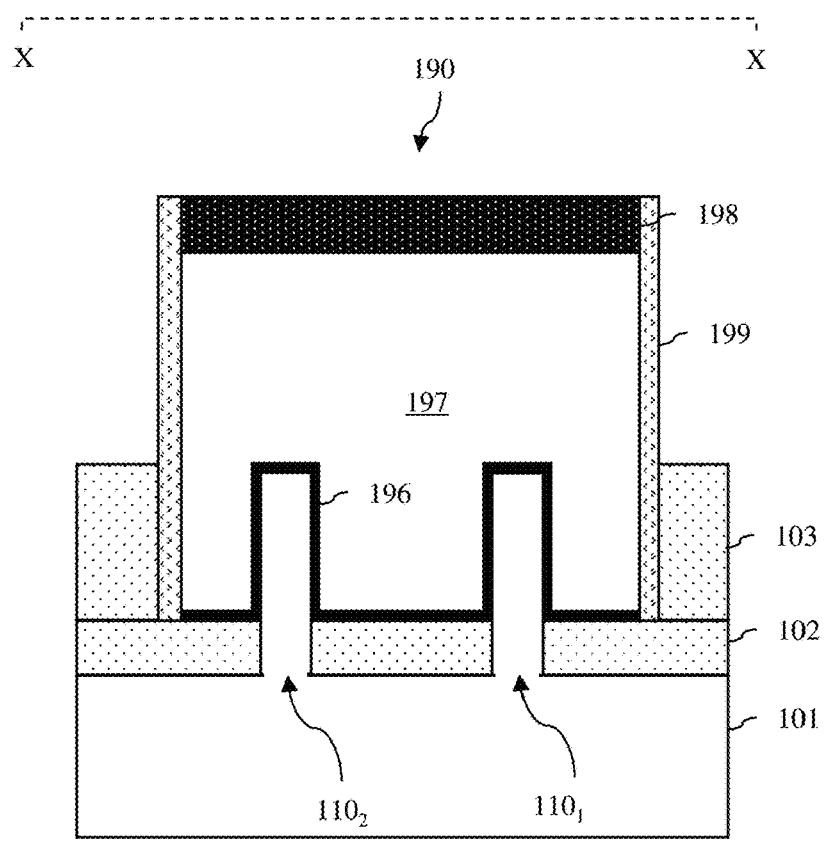

For example, in some embodiments, collector/emitter processing can include formation of a blanket first dielectric layer 103 over the partially completed structure and then etching back of the first dielectric layer 103 to expose the top surfaces of the collector and emitter portions of the semiconductor fin(s) on either side of the sacrificial base structure 190 (see the different cross-section diagrams of FIGS. 7A and 7B). This first dielectric layer 103 can, for example, be made of silicon dioxide or some other suitable dielectric material that is different from the material of the sidewall spacers 199 and hardmask layer 198 so that it can be selectively etched back, while leaving the sidewall spacers 199 and hardmask layer 198 essentially intact. Also as shown in FIGS. 7A and 7B, optionally, a shallow collector/emitter extension dopant implantation process can be performed. This dopant implantation process can be performed such that the resulting extension regions 121 and 131 are adjacent the top surface of the substrate on opposing sides of the sacrificial base structure 190 and such that they have the second-type conductivity at a relatively low conductivity level. Thus, for example, the extension regions 121 and 131 can have N-conductivity in the case of an NPN-type BJT or P-conductivity in the case of a PNP-type BJT. As illustrated, the extension regions 121 and 131 can extend laterally under the sidewalls spacers 199 on top of the semiconductor fin(s). Collector/emitter processing can further include forming collector and emitter recesses 801 in exposed collector and emitter portions of the semiconductor fin(s) on opposing sides of the sacrificial base structure 190 (see the different cross-section diagrams of FIGS. 8A and 8B). Such recesses can be formed using, for example, a selective anisotropic etch process. This etch process can, for example, be performed so that the collector and emitter recesses extend completely through the collector and emitter extension regions 121 and 131 and so that the bottoms of the collector and emitter recesses 801 are at some level below the bottoms of the collector and emitter extension regions 121 and 131. Thus, the remaining portions of the collector and emitter extension regions 121 and 131 are those portions aligned below the dielectric sidewall spacers 199. Collector/emitter processing can further include forming collector and emitter semiconductor layers 122 and 132 so as to fill or over fill the collector and emitter recesses 801 (see the different cross-section diagrams of FIGS. 9A and 9B). The collector and emitter semiconductor layers 122 and 132 can be epitaxial semiconductor layers concurrently selectively grown on exposed surfaces of the semiconductor fin(s) in the collector and emitter recesses 801 such that they are monocrystalline in structure. The collector and emitter semiconductor layers 122 and 132 can, for example, be made of the same semiconductor material (e.g., silicon) as the semiconductor fin(s). Additionally, they can be in situ doped so as to have the second-type conductivity at a relatively high conductivity level. Thus, for example, the collector and emitter semiconductor layers can be in situ doped so as to have N+ conductivity in the case of an NPN-type BJT or P+ conductivity in the case of a PNP-type BJT. It should also be noted that, in the multi-fin embodiments, collector/emitter epitaxial deposition can be performed so that the collector semiconductor layers 122 on adjacent fins remain physically separated so that the BJT has multiple collector regions and so that the emitter semiconductor layers 132 on adjacent fins also remain physically separated so that the BJT has multiple emitter regions. In this case, the multiple collector regions across all of the semiconductor fins can be electrically connected during middle of the line (MOL) and/or back end of the line (BEOL) processing (e.g., by the formation of a local interconnect, a conductive strap, or a combination of MOL contacts and BEOL wiring). Alternatively, collector/ emitter epitaxial deposition can be performed so that the collector semiconductor layers 122 on adjacent fins merged to form a single relatively large collector region 120 and so that the emitter semiconductor layers 132 on adjacent fins can similarly be merged to form a single relatively large emitter region 130.

It should be understood that the exemplary collector/ emitter processing techniques described above and illustrated in the figures are not intended to be limiting. Alternatively, any other suitable collector/emitter processing could be performed to form collector and emitter regions 120 and 130 on opposing sides of the sacrificial base structure 190.

Figure 10A:
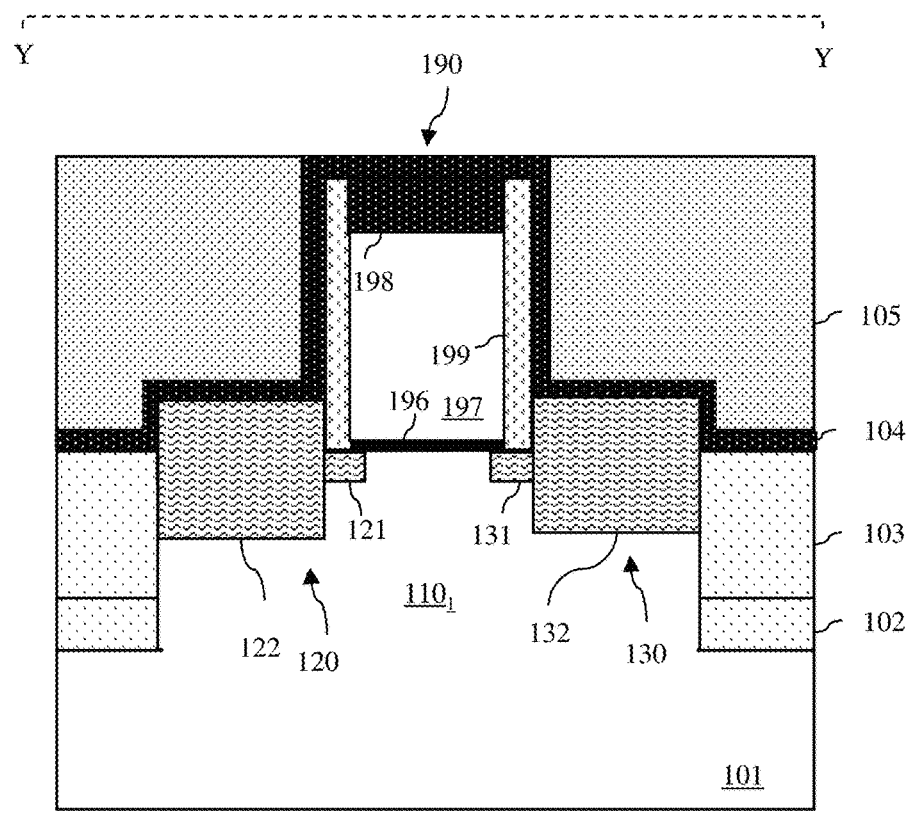
FIGS. 10A-10B are two different cross-section diagrams of a partially completed semiconductor structure formed according to the flow diagram of FIG. 3.
Figure 10B:
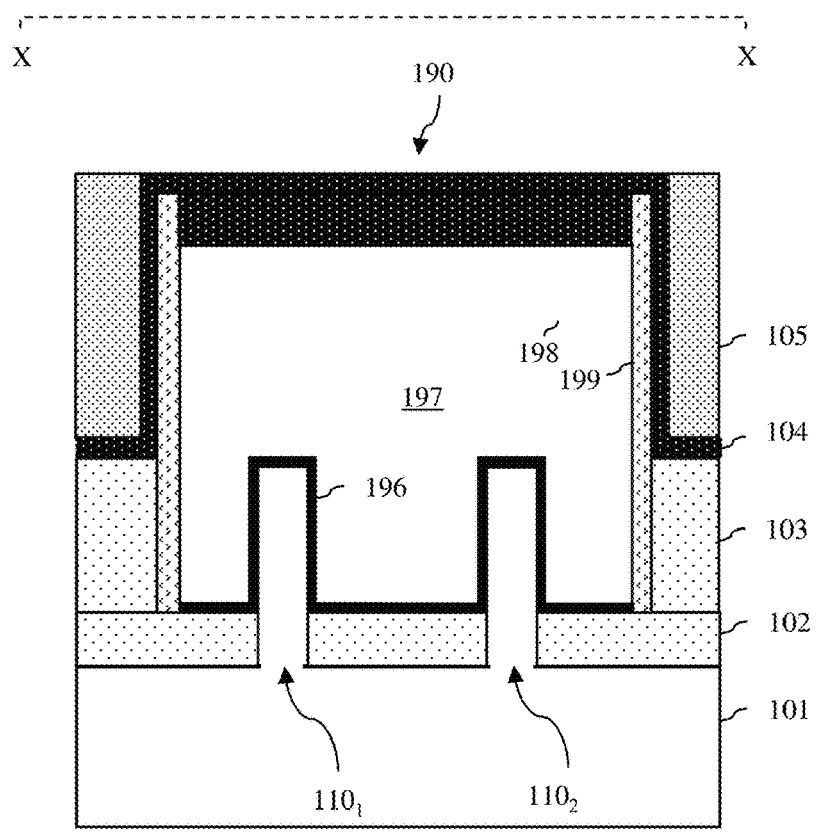

One or more MOL dielectric layers can be formed over the partially completed structure (see process 310, see also the different cross-section diagrams of FIGS. 10A and 10B). The dielectric layers formed at process 310 can include, for example, a relatively thin, essentially conformal second dielectric layer 104 (also referred to herein as an etch stop layer) covering the first dielectric layer 103, the collector region 120, and the emitter region 130 and further positioned laterally immediately adjacent to and covering the outer surfaces of the sidewall spacers 199. This second dielectric layer 104 can be, for example, a silicon nitride layer or some other suitable layer of etch stop material. The dielectric layers formed at process 310 can also include, for example, a blanket third dielectric layer 105 on the second dielectric layer 104. This blanket third dielectric layer 105 could be, for example, a silicon dioxide layer, a doped silicon glass layer (e.g., a phosphosilicate glass (PSG) layer or a borophosphosilicate glass (BPSG) layer), or any other suitable layer of interlayer dielectric material. A polishing process (e.g., a conventional chemical mechanical polishing (CMP) process) can be performed to expose the top surface of the portion of the second dielectric layer 104 above the sacrificial base structure 190 and, optionally, to expose the hardmask layer 198 below.

Figure 11A:
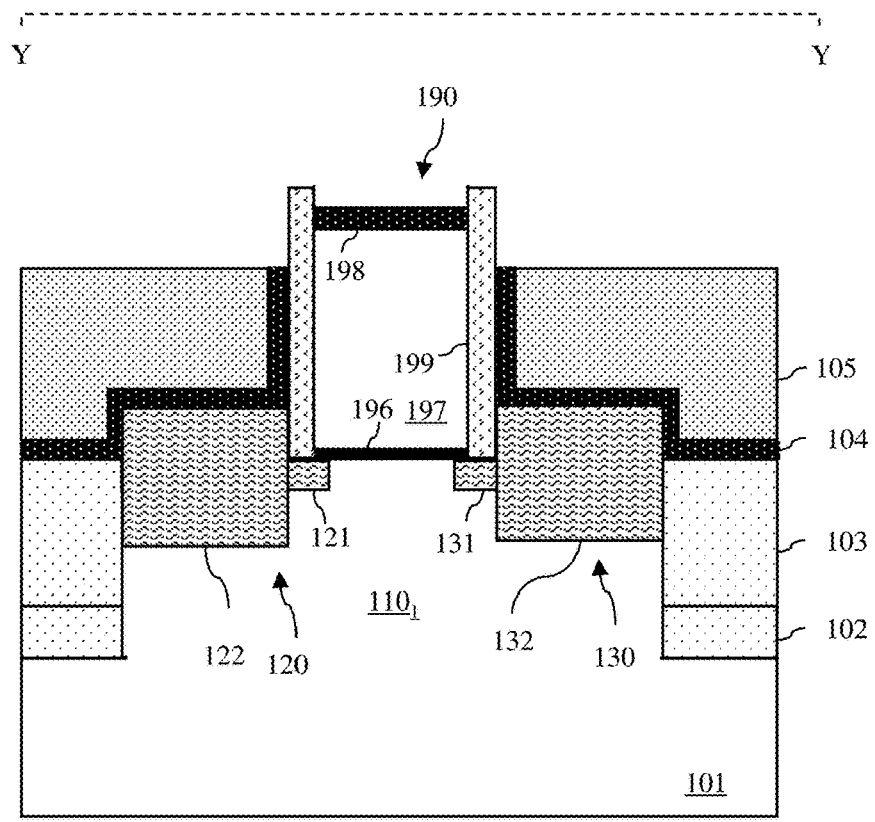
FIGS. 11A-11B are two different cross-section diagrams of a partially completed semiconductor structure formed according to the flow diagram of FIG. 3.
Figure 11B:
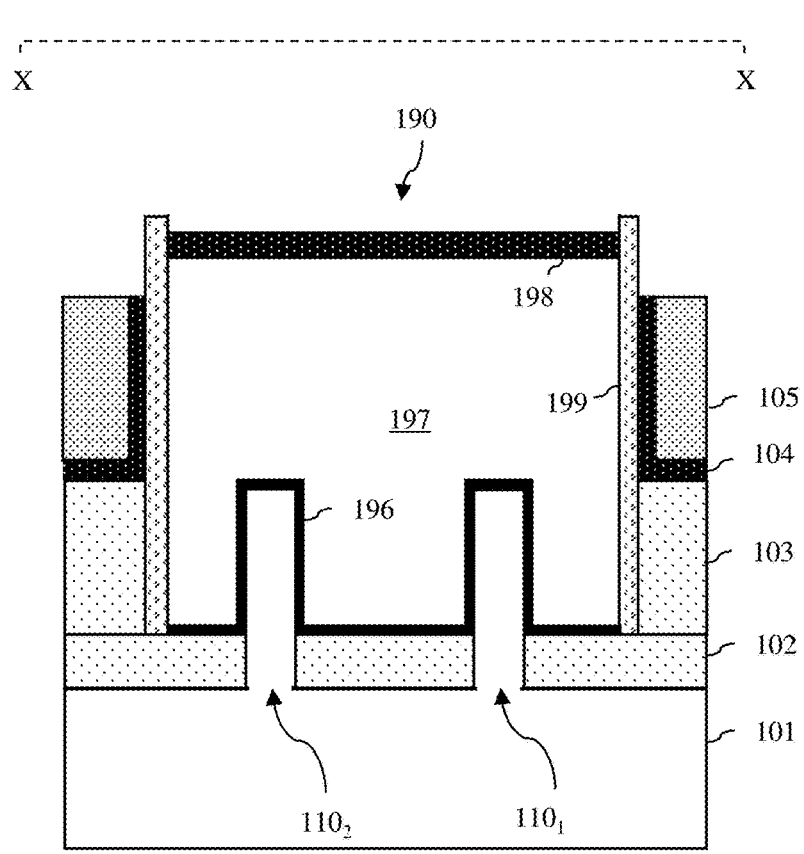
Figure 12A:
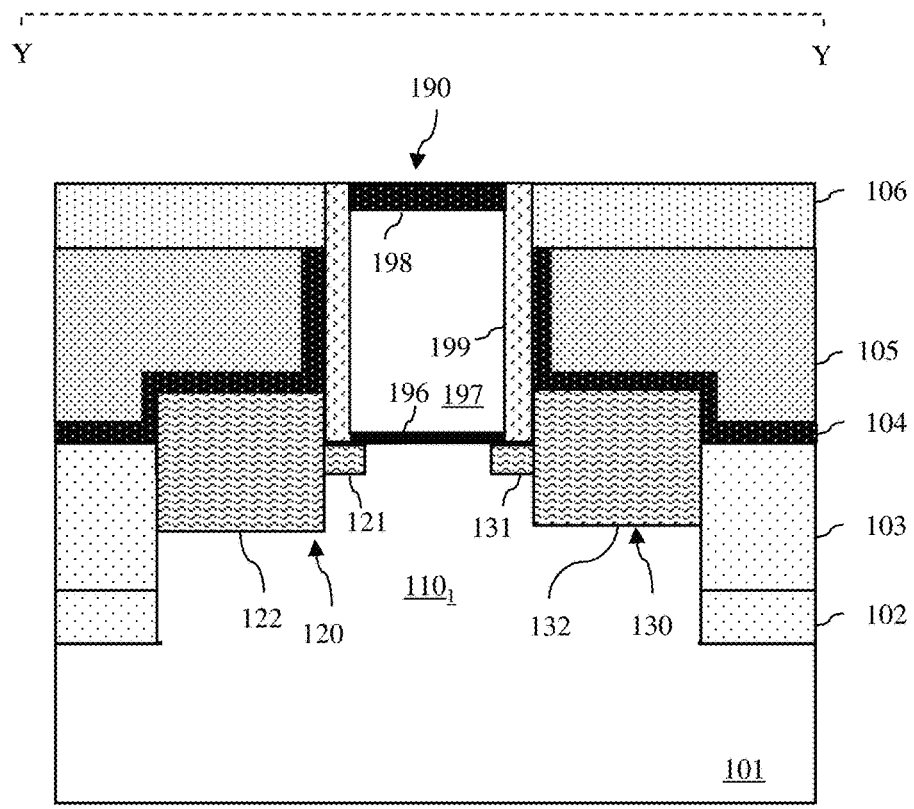
FIGS. 12A-12B are two different cross-section diagrams of a partially completed semiconductor structure formed according to the flow diagram of FIG. 3.
Figure 12B:
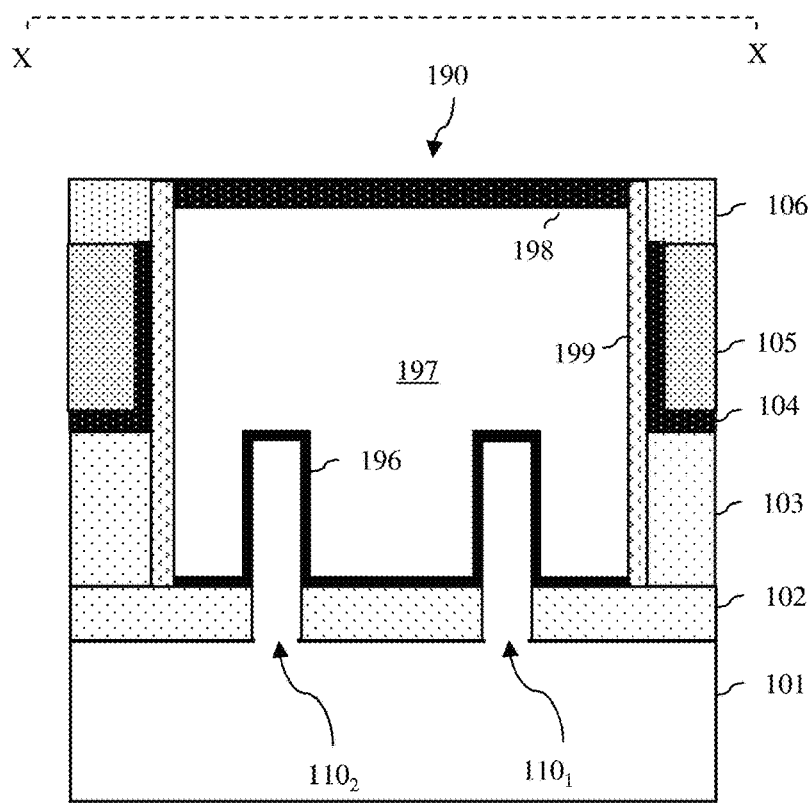

Optionally, exposed dielectric material of the layers 104, 105 and 198 can be etched back (see the different cross-section diagrams of FIGS. 11A and 11B) and a high density plasma (HDP) oxide layer 106 (see the different cross-section diagrams of FIGS. 12A and 12B) can be deposited on the partially completed structures. This HDP oxide layer 106 can be deposited using, for example, plasma enhanced chemical vapor deposition (PECVD). Formation of the HDP oxide layer 106 can be followed by another CMP process to remove all HDP oxide material from above the hardmask layer 198.

Figure 13A:
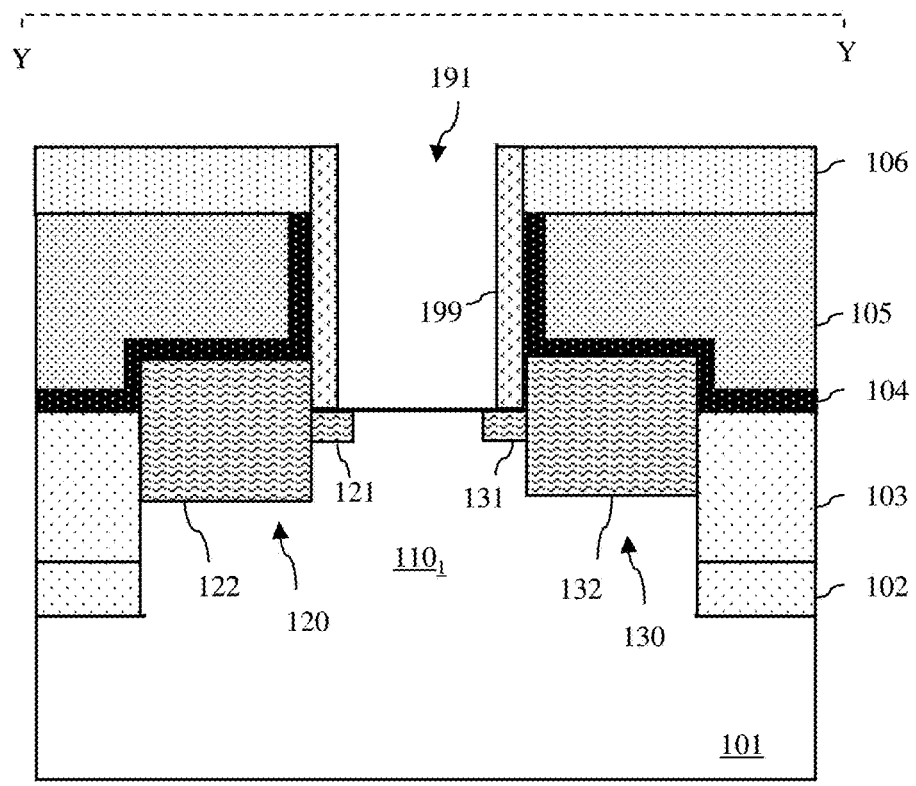
FIGS. 13A-13B are two different cross-section diagrams of a partially completed semiconductor structure formed according to the flow diagram of FIG. 3.
Figure 13B:
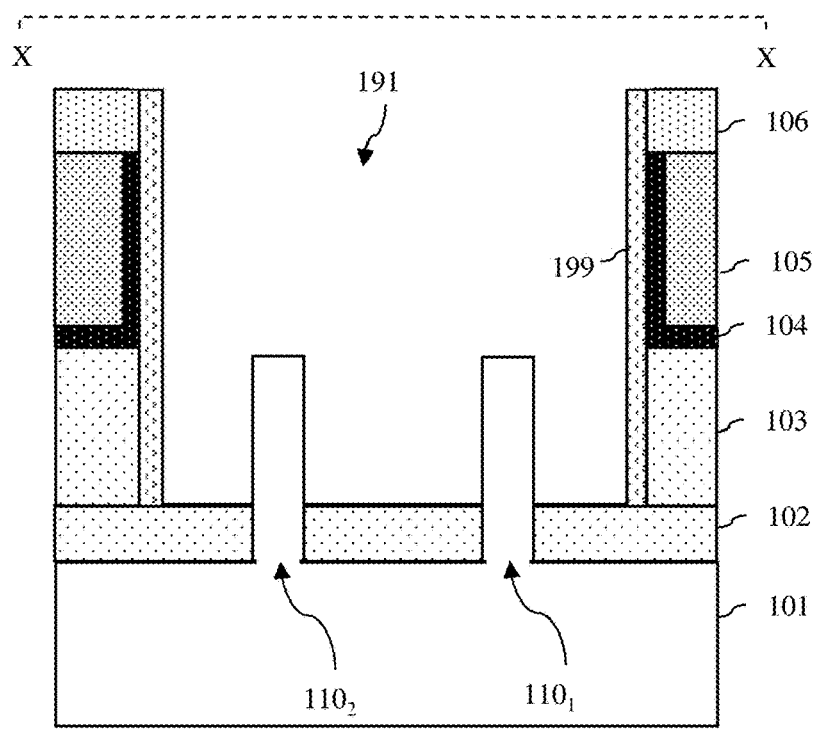

Next, the sacrificial base structure 190 can be selectively removed (see process 312). For example, selective etch processes can be performed in order to remove each layer of the sacrificial base structure 190 (e.g., the hardmask layer 198, the polysilicon layer 197, and the oxide layer 196), thereby forming a base opening 191 that exposes the top surface and opposing sidewalls of the base portion of each semiconductor fin (e.g., $110_1$-$110_2$) as well as the top surface of the insulator layer 102 on both sides each fin and extending between adjacent fins (if applicable) (see the different cross-section diagrams of FIGS. 13A and 13B).

Following formation of the base opening 191, a base region 140 can be formed within the base opening 191 (see process 316). FIGS. 14A-16B illustrate the processes, described in greater detail below, used to form the base region 140 of the lateral BJT 100.1B of FIGS. 1 and 1B; whereas FIGS. 17A-19B illustrate the processes, also described in greater detail below, used to form the base region 140 of the lateral BJT 100.2B of FIGS. 2 and 2B.

Specifically, base recess(es) can be formed in the base portion(s), respectively, of the semiconductor fin(s) exposed within the base opening 191 (see process 316). That is, a base recess can be formed in the base portion of each semiconductor fin exposed within the base opening 191. The base recess(es) can be formed by a selective etch process to reduce the height of the base portion(s) of the semiconductor fin(s) exposed within the base opening 191. The base region 140 can include a base recess in a base portion of each semiconductor fin. The base recess can extend downward from the top of the base portion of the semiconductor fin and can further extend laterally across the full first width through the opposing sidewalls. In some embodiments, the etch process can be timed such that the bottom(s) of the base recess(es) (i.e., the height(s) of the base portion(s) of the fin(s) in the base opening 191) is/are at some level above the top surface of the insulator layer 102 (e.g., see the different cross-section diagrams of FIGS. 14A and 14B). That is, although recessed, the base portion of the semiconductor fin(s) will still extend vertically above the level of the top surface of the insulator layer 102. In other embodiments, the etch process can be timed such that the bottom(s) of the base recess(es) (i.e., the height(s) of the base portion(s) of the fin(s) in the base opening 191) is/are essentially level with the top surface of the insulator layer 102 (e.g., see the different cross-section diagrams of FIGS. 17A and 17B). That is, the base portion(s) of the semiconductor fin(s) do not extend vertically above the level of the top surface of the insulator layer 102. It should be noted that the depth of the base recess(es) can be selectively adjusted based, for example, on simulation results in order to achieve optimal performance.

Figure 14A:
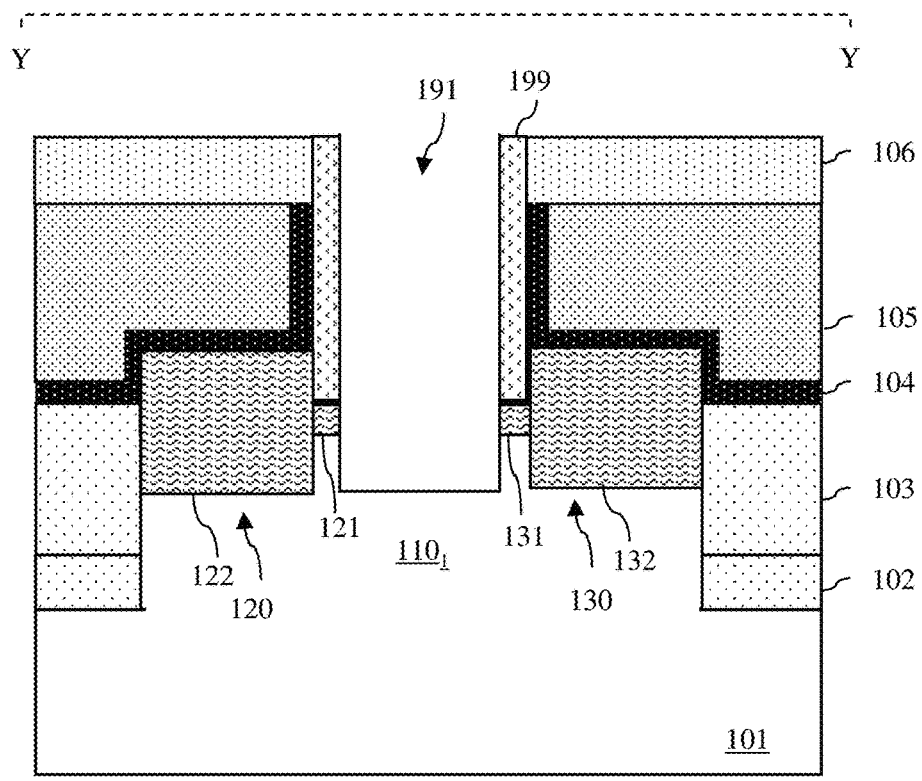
FIGS. 14A-14B are two different cross-section diagrams of a partially completed semiconductor structure formed according to the flow diagram of FIG. 3.
Figure 14B:
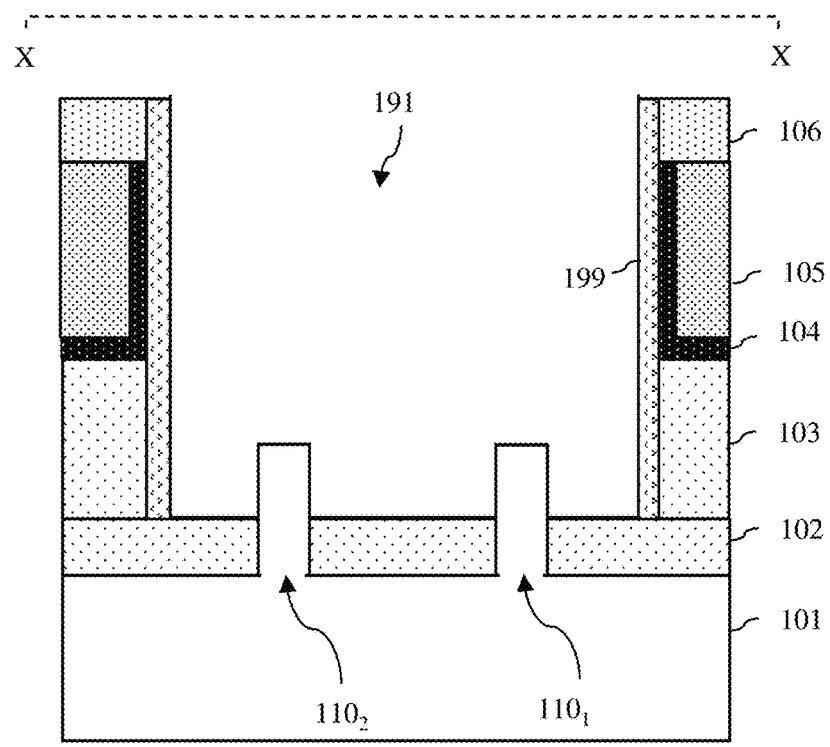
Figure 17A:
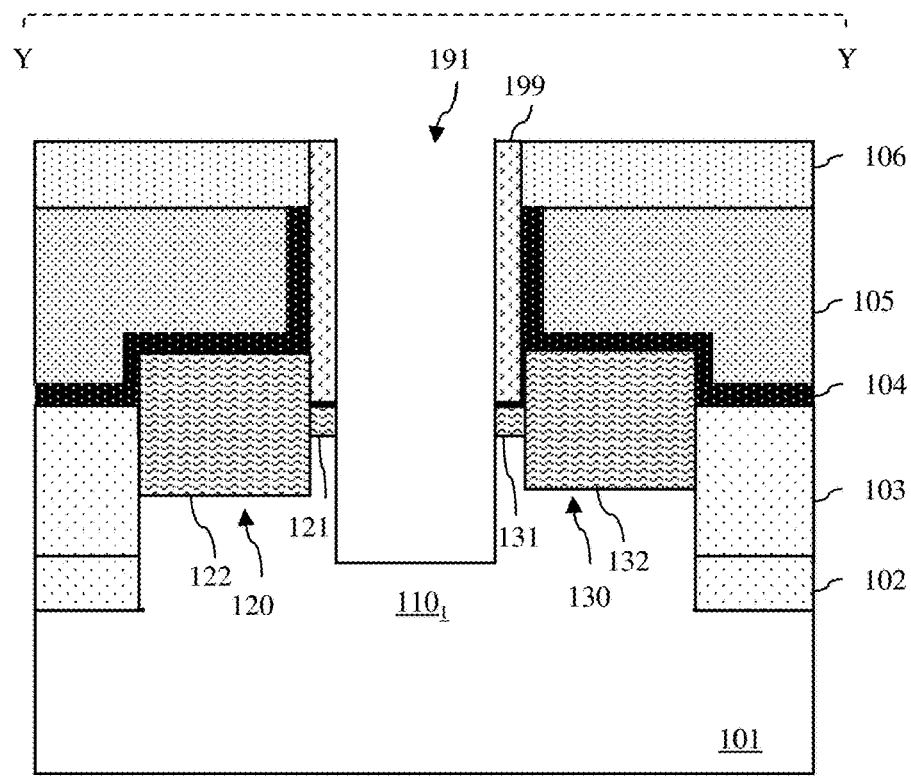
FIGS. 17A-17B are two different cross-section diagrams of a partially completed semiconductor structure formed according to the flow diagram of FIG. 3.
Figure 17B:
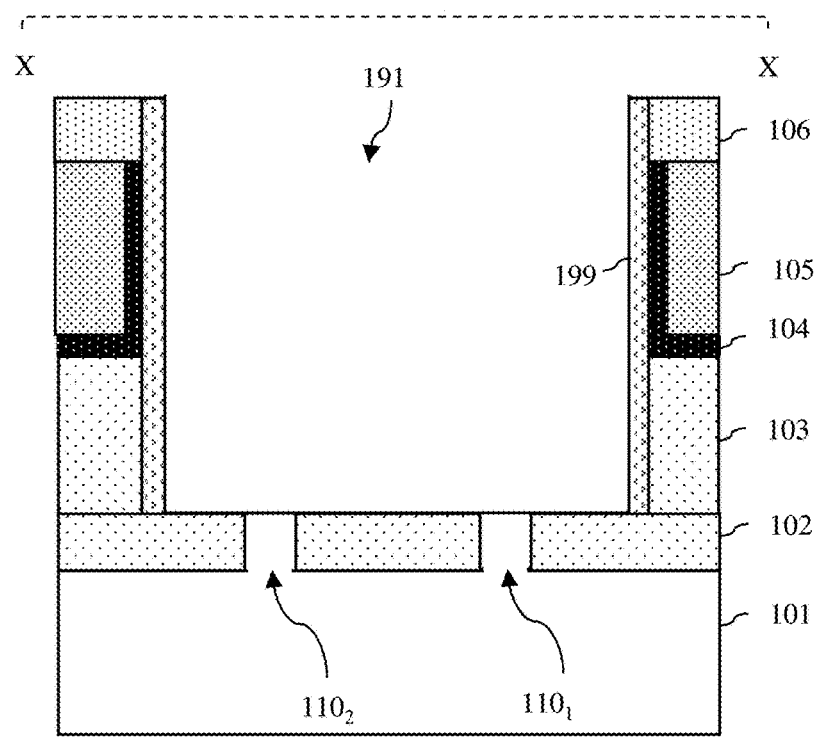

Next, base semiconductor layer(s) 141 can be formed and, more particularly, selectively epitaxially grown on exposed semiconductor surfaces of the base portion(s) of the semiconductor fin(s) within the base opening 191 (see process 318). If forming a non-heterojunction BJT, the base semiconductor layer(s) 141 can be the same semiconductor material as the semiconductor fin(s) (e.g., silicon). If forming an HBT, the base semiconductor layer(s) 141 can be made of a different semiconductor material (e.g., silicon germanium). In any case, due to this selective epitaxial grown process, the base semiconductor layer(s) 141 will be monocrystalline in structure. The base semiconductor layer(s) 141 can be either undoped (i.e., intrinsic semiconductor layer(s)) or in situ doped at process 318 so as to have the first-type conductivity at a relatively low conductivity level (e.g., so as to have P-conductivity in the case of an NPN-type BJT or N-conductivity in the case of a PNP-type BJT). In any case, if the base portion(s) of the semiconductor fin(s) extend vertically above the level of the top surface of the insulator layer 102, as shown in FIGS. 14A and 14B, then, on each semiconductor fin, the base semiconductor layer 141 will be grown in the base recess (i.e., on the top of the base portion of the semiconductor fin) and also on the opposing sidewalls and will have a second width (W2) that is wider than the first width (W1), as measured in the same direction (e.g., see the different cross-section diagrams of FIGS. 15A and 15B). However, if the base portion(s) of the semiconductor fin(s) are level with the top surface of the insulator layer 102, as shown in FIGS. 17A and 17B, then, on each semiconductor fin, the base semiconductor layer 141 will be grown in the base recess only (i.e., only on the top of the base portion of the semiconductor fin) but will still have a second width (W2) that is wider than the first width (W1), as measured in the same direction (e.g., see the different cross-section diagrams of FIGS. 18A and 18B).

Figure 15A:
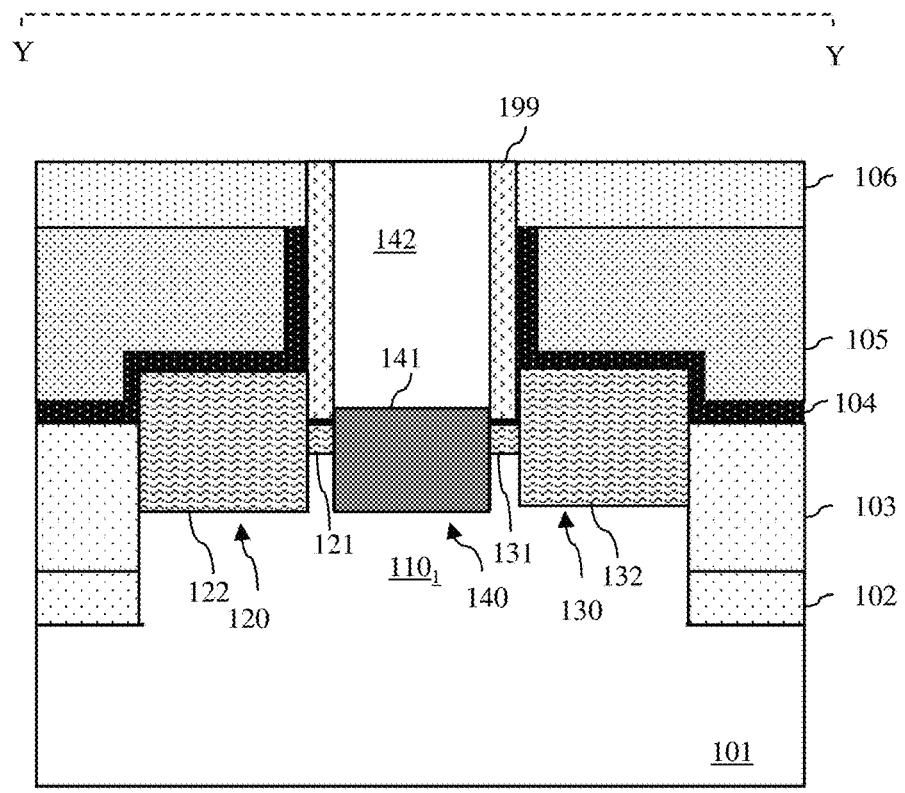
FIGS. 15A-15B are two different cross-section diagrams of a partially completed semiconductor structure formed according to the flow diagram of FIG. 3.
Figure 15B:
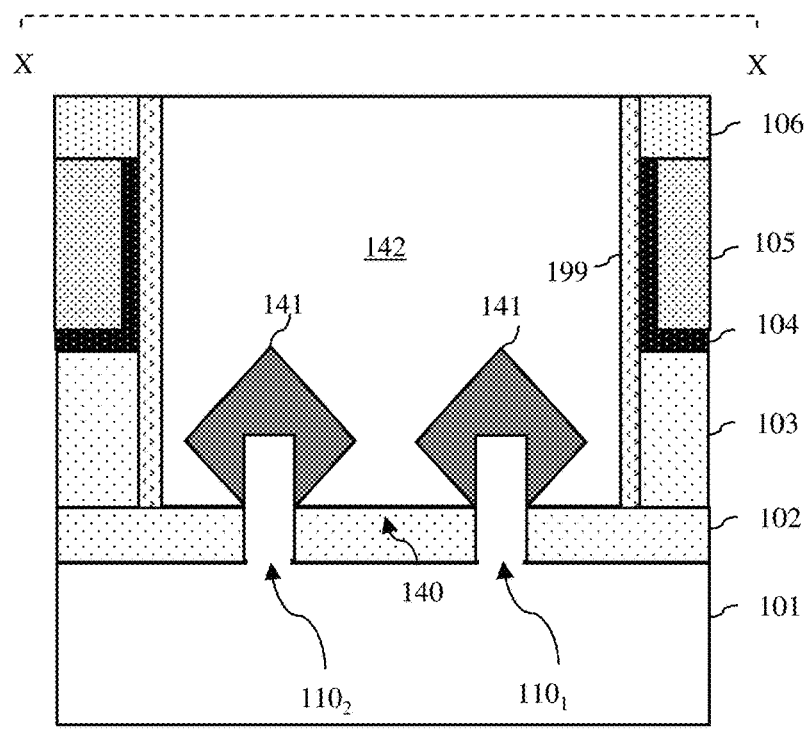
Figure 18A:
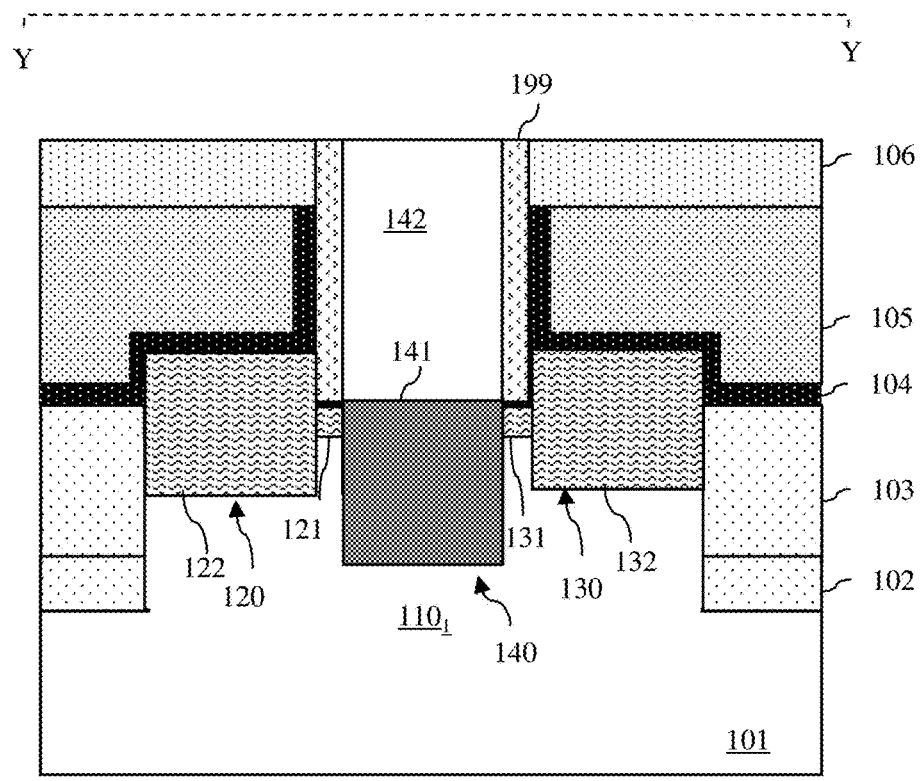
FIGS. 18A-18B are two different cross-section diagrams of a partially completed semiconductor structure formed according to the flow diagram of FIG. 3.
Figure 18B:
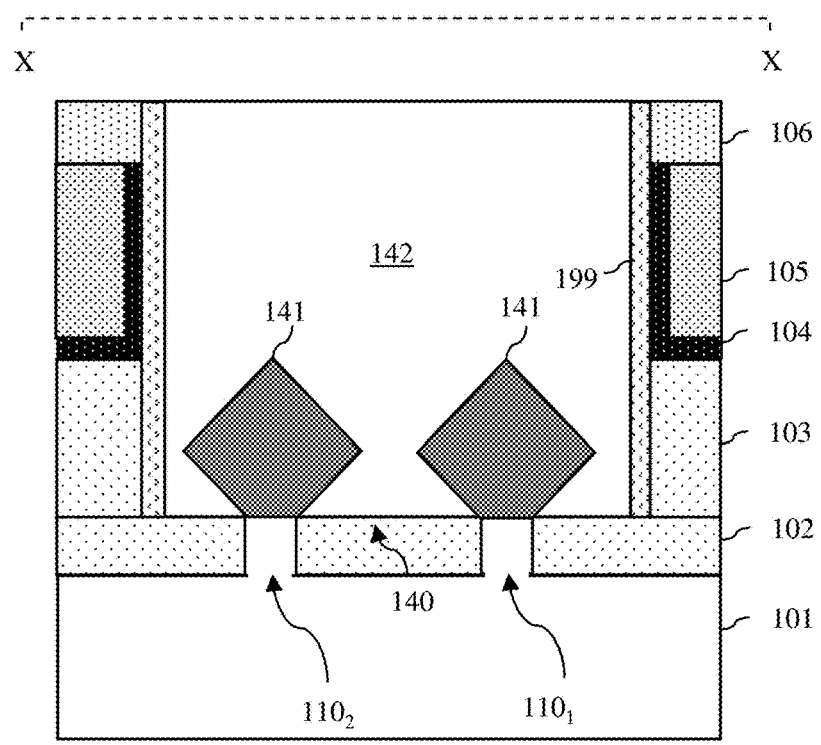

Once the base semiconductor layer(s) 141 are formed, an additional base semiconductor layer 142 can be formed and, more particularly, non-selectively epitaxially grown so as to fill the remaining space within the base opening 191 (see process 320, see the different cross-section diagrams of FIGS. 15A and 15B and also the different cross section diagrams of FIGS. 18A and 18B). The additional base semiconductor layer 142 can be, for example, polysilicon and can be in situ doped so as to have the first-type conductivity at a relatively high conductivity level and, particularly, at a higher level than the base semiconductor layer(s). Thus, for example, the additional base semiconductor layer 142 can have P+ conductivity in the case of an NPN-type BJT or N+ conductivity in the case of a PNP-type BJT. As illustrated, the additional base semiconductor layer 142 can cover the top of each base semiconductor layer 141. Optionally, depending upon the size of the base opening and the size of the base semiconductor layer(s), the additional base semiconductor layer 142 can also cover two sides of each base semiconductor layers 141 wrapping down to the top surface of the insulator layer 102.

It should be noted that selective removal of the sacrificial base structure to form the base opening 191 can optionally be performed concurrently with selective removal of sacrificial gate structures to form gate openings during finFET processing elsewhere on the substrate. However, in this case, removal of the sacrificial gate structures will stop on the oxide layer without exposing the semiconductor fin in the gate openings and a protective layer (e.g., a photoresist layer) will be deposited and patterned so as to cover the gate openings during formation of the base region 140. Then, the protective layer will be selectively removed and replacement metal gate (RMG) processing will be performed (i.e., RMGs will be formed in the gate openings).

Figure 16A:
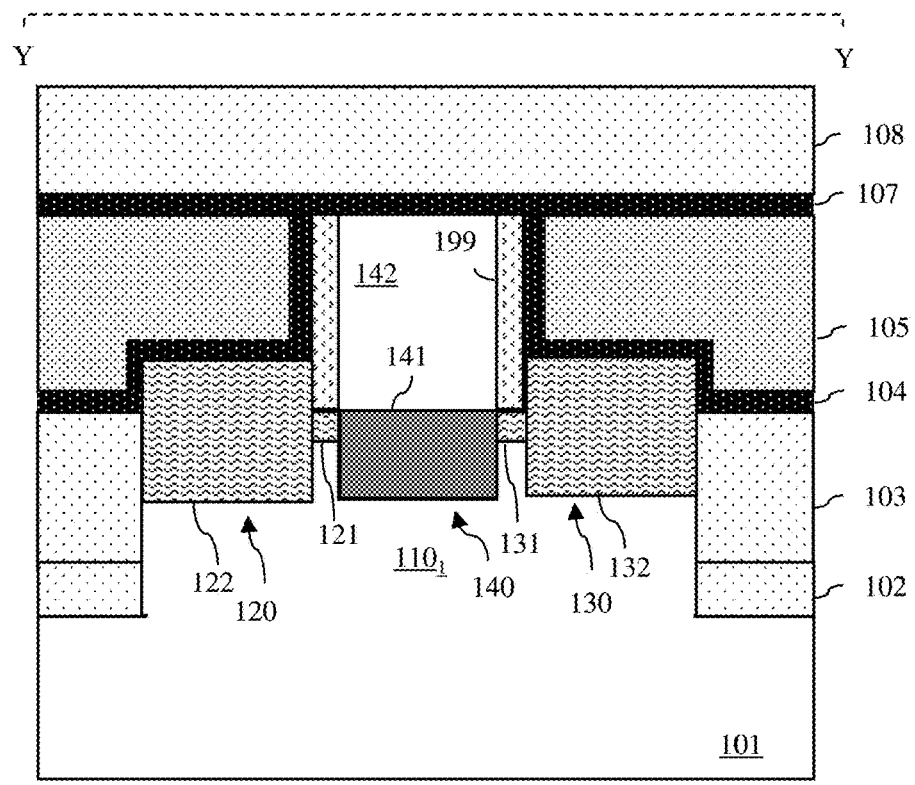
FIGS. 16A-16B are two different cross-section diagrams of a partially completed semiconductor structure formed according to the flow diagram of FIG. 3.
Figure 16B:
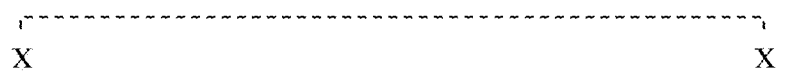
Figure 19A:
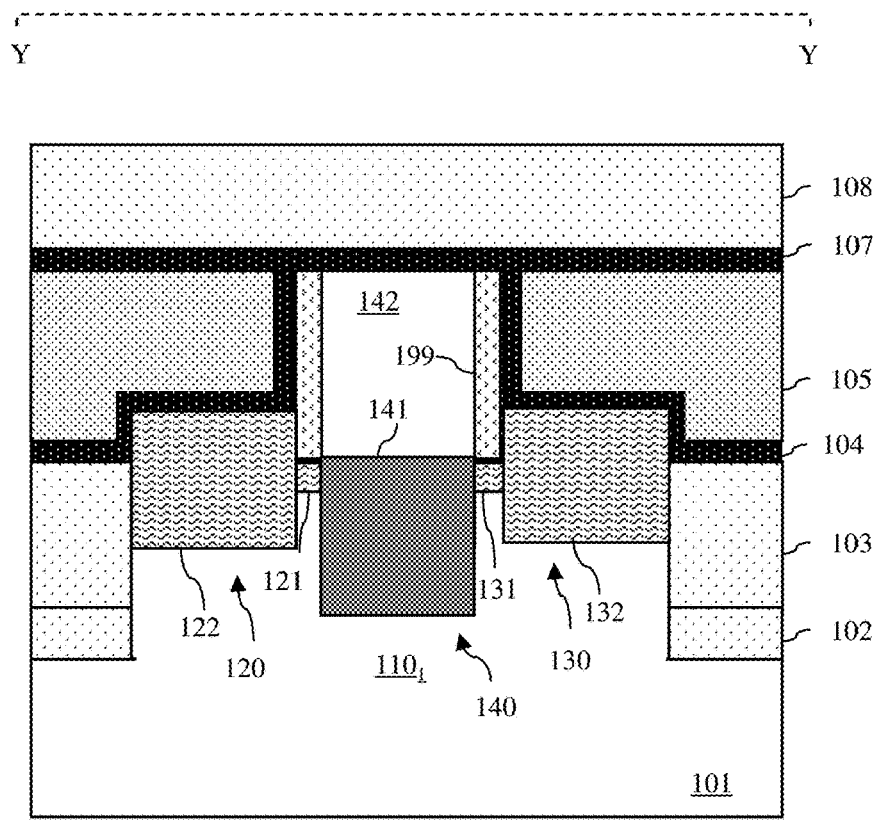
FIGS. 19A-19B are two different cross-section diagrams of a partially completed semiconductor structure formed according to the flow diagram of FIG. 3.
Figure 19B:
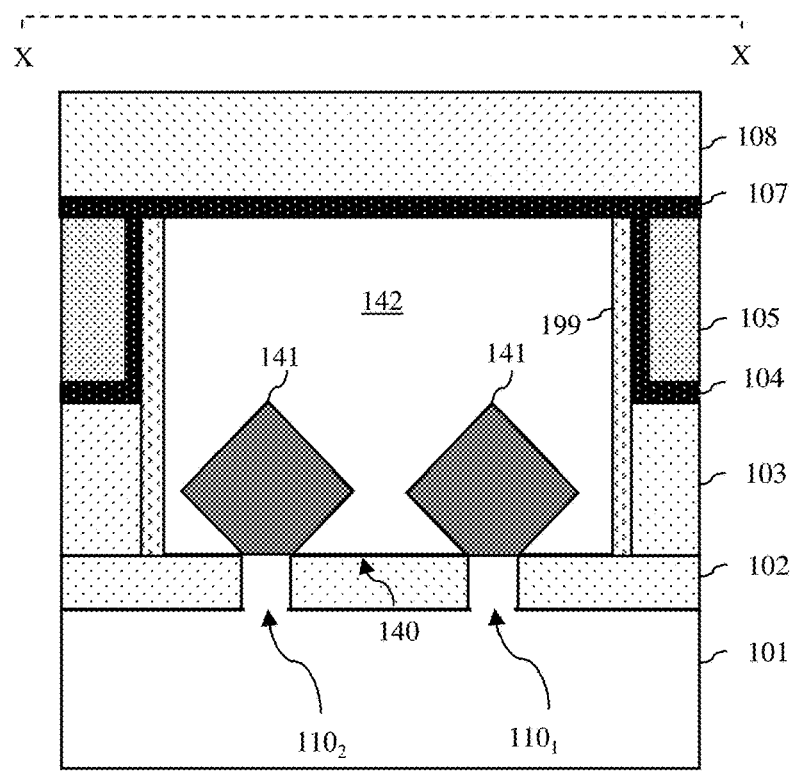

After formation of the base region 140 for the lateral BJT (and, if applicable, after formation of RMGs for finFETs), a CMP process can be performed in order to remove all material above the level of the third dielectric layer 105 (including the HDP oxide layer 106) and one or more additional MOL dielectric layers can be formed on the partially completed structure (see process 322, see also the different cross-section diagrams of FIGS. 16A and 16B and the different cross-section diagrams of FIGS. 19A and 19B). The additional MOL dielectric layers can include a relatively thin fifth dielectric layer 107 (also referred to herein as an additional etch stop layer) on the top surface of the third blanket dielectric layer 105, the top ends of the second dielectric layer 104 and the sidewall spacers 199, and further on the top surface of the additional base semiconductor layer 142. This fifth dielectric layer 107 can be, for example, an additional silicon nitride layer or some other suitable layer of etch stop material. The additional MOL dielectric layers can also include a blanket sixth dielectric layer 108 on the fifth dielectric layer 107. This blanket sixth dielectric layer 108 could be, for example, a silicon dioxide layer, a doped silicon glass layer (e.g., a phosphosilicate glass (PSG) layer or a borophosphosilicate glass (BPSG) layer), or any other suitable layer of interlayer dielectric material.

Additional processing can subsequently be performed in order to complete the lateral BJT (e.g., see the lateral BJT 100.1B shown in FIGS. 1 and 1B and the lateral BJT 100.2B shown in FIGS. 2 and 2B). This additional processing can include, but is not limited to, the formation of contacts 182-184 that extend through one or more of the MOL dielectric layers to the BJT terminals (i.e., to the collector region 120, to the emitter region 130 and to the base region 140). Techniques for forming contacts are well known in the art and, thus, the details have been omitted from this specification in order to allow the reader to focus on the salient aspects of the disclosed embodiments.

In the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

Additionally, it should be understood that the method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

Finally, the descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a semiconductor fin having opposing sidewalls, a first width, collector and emitter recesses, and a base recess positioned laterally between and separated from the collector and emitter recesses, wherein the base recess extends across the first width through the opposing sidewalls;
    a base region comprising:
        a base semiconductor layer on the semiconductor fin at least in the base recess, wherein the base semiconductor layer has a second width that is wider than the first width such that the base semiconductor layer extends laterally beyond the opposing sidewalls; and
        an additional base semiconductor layer on the base semiconductor layer; and
    collector and emitter regions in the collector and emitter recesses, respectively, wherein top surfaces of the collector and emitter regions are above a level of a top surface of the base semiconductor layer.

2. The structure of claim 1, wherein the base semiconductor layer is monocrystalline and the additional base semiconductor layer is polycrystalline.

3. The structure of claim 1, wherein the semiconductor fin and the additional base semiconductor layer comprise silicon and the base semiconductor layer comprises a silicon germanium.

4. The structure of claim 1, wherein the additional base semiconductor layer has a first type conductivity and the base semiconductor layer either has the first type conductivity at a lower conductivity level than the additional base semiconductor layer or is undoped.

5. The structure of claim 1, further comprising an insulator layer adjacent to the opposing sidewalls of the semiconductor fin,
    wherein a bottom of the base recess and bottoms of the collector and emitter recesses are above a level of a top surface of the insulator layer, wherein the base semiconductor layer extends along the opposing sides of the semiconductor fin to the top surface of the insulator layer, and wherein the additional base semiconductor layer wraps over the base semiconductor layer to the insulator layer and fills remaining space within a base opening that extends through interlayer dielectric material to the semiconductor fin, that has a third width that is wider than the second width, and that has vertical surfaces lined with sidewall spacers.

6. The structure of claim 1, further comprising an insulator layer adjacent to the opposing sidewalls of the semiconductor fin, wherein a bottom of the base recess is approximately level with a top surface of the insulator layer, wherein bottoms of the collector and emitter recesses are above a level of the top surface of the insulator layer, and wherein the additional base semiconductor layer wraps over the base semiconductor layer to the insulator layer and fills remaining space within a base opening that extends through interlayer dielectric material to the semiconductor fin, that has a third width that is wider than the second width, and that has vertical surfaces lined with sidewall spacers.

7. The structure of claim 1, further comprising, within the semiconductor fin, extension regions positioned laterally between the base recess and the collector and emitter recesses, wherein the extension regions have a different type conductivity than the additional base semiconductor layer.

8. The structure of claim 7, wherein the collector region and the emitter region have a same type conductivity as the extension regions at a higher conductivity level.

9. A structure comprising:

multiple semiconductor fins, wherein each semiconductor fin has opposing sidewalls, a first width, collector and emitter recesses, and a base recess positioned laterally between and separated from the collector and emitter recesses, wherein the base recess extends across the first width through the opposing sidewalls;

a base region comprising:

base semiconductor layers, wherein each base semiconductor layer is on a corresponding semiconductor fin at least in the base recess, wherein the base semiconductor layer has a second width that is wider than the first width such that the base semiconductor layer extends laterally beyond the opposing sidewalls of the corresponding semiconductor fin; and an additional base semiconductor layer on the base semiconductor layers; and collector and emitter regions in the collector and emitter recesses, respectively, wherein top surfaces of the collector and emitter regions are above a level of top surfaces of the base semiconductor layers.

10. The structure of claim 9, wherein the base semiconductor layers are monocrystalline and the additional base semiconductor layer is polycrystalline.

11. The structure of claim 9, wherein the semiconductor fins and the additional base semiconductor layer comprise silicon and the base semiconductor layers comprise silicon germanium.

12. The structure of claim 9, wherein the additional base semiconductor layer has a first type conductivity and the base semiconductor layer either has the first type conductivity at a lower conductivity level than the additional base semiconductor layer or is undoped.

13. The structure of claim 9, further comprising an insulator layer adjacent to the opposing sidewalls of and extending between the semiconductor fins, wherein, in each semiconductor fin, a bottom of the base recess and bottoms of the collector and emitter recesses are above a level of a top surface of the insulator layer, wherein the base semiconductor layers extend along the opposing sides of the semiconductor fins to the top surface of the insulator layer, and wherein the additional base semiconductor layer wraps over each of the base semiconductor layers to the insulator layer and fills remaining space with a base opening that extends through interlayer dielectric material to each semiconductor fin and that has vertical surfaces lined with sidewall spacers.

14. The structure of claim 9, further comprising an insulator layer adjacent to the opening sidewalls of and extending between the semiconductor fins, wherein, in each semiconductor fin, a bottom of the base recess is approximately level with a top surface of the insulator layer and bottoms of the collector and emitter recesses are above a level of the bottom of the base recess, and wherein the additional base semiconductor layer wraps over each of the base semiconductor layers to the insulator layer and fills remaining space within a base opening that extends through interlayer dielectric material to each semiconductor fin and that has vertical surfaces lined with sidewall spacers.

15. A method comprising:

forming a semiconductor fin having opposing sidewalls and a first width;

forming, in the semiconductor fin, collector and emitter recesses and a base recess positioned laterally between and separated from the collector and emitter recesses, wherein the base recess that extends across the first width through the opposing sidewalls; and forming collector and emitter regions in the collector and emitter recesses, respectively, and a base region in the base recess, wherein the base region includes a base semiconductor layer on the semiconductor fin at least in the base recess, wherein the base semiconductor layer has a second width that is wider than the first width such that the base semiconductor layer extends laterally beyond the opposing sidewalls; and an additional base semiconductor layer on the base semiconductor layer, and wherein top surfaces of the collector and emitter regions are above a level of a top surface of the base semiconductor layer.

16. The method of claim 15, wherein the semiconductor fin comprises monocrystalline silicon, wherein the base semiconductor layer is formed by selectively epitaxially growing monocrystalline silicon germanium on exposed surfaces of a base portion of the semiconductor fin within a base opening, and wherein the additional base semiconductor layer is formed by non-selectively epitaxially growing polysilicon within the base opening.

17. The method of claim 16, wherein the additional base semiconductor layer is in situ doped so as to have a first type conductivity and wherein the base semiconductor layer is either in situ doped so as to have the first type conductivity at a lower conductivity level than the additional base semiconductor layer or is undoped.

18. The method of claim 16,
wherein an insulator layer is adjacent to the opposing sidewalls of the semiconductor fin,
wherein the base recess formed so that a bottom of the base recess is above a level of a top surface of the insulator layer,
wherein the base semiconductor layer is further formed so as to extend along the opposing sides of the semiconductor fin to the top surface of the insulator layer,
wherein the additional base semiconductor layer is further formed so as to wrap over the base semiconductor layer to the insulator layer and fill remaining space within the base opening, and
wherein the collector and emitter recesses are formed so bottoms of the collector and emitter recesses are above the level of the top surface of the insulator layer.

19. The method of claim 16,
wherein the insulator layer is adjacent to the opposing sidewalls of the semiconductor fin,
wherein the base recess is formed so that a bottom of the base recess is approximately level with a top surface of the insulator layer,
wherein the additional base semiconductor layer is further formed so as to wrap over the base semiconductor layer to the insulator layer and fill remaining space within the base opening, and
wherein the collector and emitter recesses are formed so that bottoms of the collector and emitter recesses are above a level of the bottom of the base recess.

20. The method of claim 19, further comprising:
forming, within the semiconductor fin, extension regions positioned laterally between the base recess and the collector and emitter recesses, wherein the additional base semiconductor layer is formed so as to have a different type conductivity than the extension regions, and
wherein the collector region and the emitter region are formed so as to have a same type conductivity as the extension regions at a higher conductivity level.

\* \* \* \* \*